United States Patent
Hata et al.

(10) Patent No.: US 7,604,911 B2
(45) Date of Patent: Oct. 20, 2009

(54) MASK PATTERN FOR SEMICONDUCTOR DEVICE FABRICATION, METHOD OF FORMING THE SAME, METHOD FOR PREPARING COATING, COMPOSITION FOR FINE PATTERN FORMATION, AND METHOD OF FABRICATING SEMICONDUCTOR DEVICE

(75) Inventors: Mitsuhiro Hata, Suwon-si (KR);
Jung-Hwan Hah, Suwon-si (KR);
Hyun-Woo Kim, Hwaseong-si (KR);
Sang-Gyun Woo, Yongin-si (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 0 days.

(21) Appl. No.: 11/949,443

(22) Filed: Dec. 3, 2007

(65) Prior Publication Data

US 2008/0076255 A1    Mar. 27, 2008

Related U.S. Application Data

(63) Continuation of application No. 10/972,302, filed on Oct. 23, 2004, now Pat. No. 7,314,691.

(30) Foreign Application Priority Data

Apr. 8, 2004    (KR) ................................ 2004-24021
Jul. 22, 2004    (KR) ................................ 2004-57163

(51) Int. Cl.
*G03F 7/004*    (2006.01)
*G03F 7/30*    (2006.01)

(52) U.S. Cl. ..................... 430/14; 430/192; 430/270.1; 430/330; 430/331

(58) Field of Classification Search .................. 430/14, 430/330, 331, 192, 270.1
See application file for complete search history.

(56) References Cited

U.S. PATENT DOCUMENTS

| 6,486,058 B1 * | 11/2002 | Chun ......................... 438/637 |
| 7,189,499 B2 * | 3/2007 | Sugeta et al. ............... 430/324 |
| 2003/0008968 A1 * | 1/2003 | Sugeta et al. ............... 524/556 |
| 2004/0067303 A1 * | 4/2004 | Sugeta et al. ............... 427/154 |

* cited by examiner

*Primary Examiner*—John S Chu
(74) *Attorney, Agent, or Firm*—F. Chau & Associates, LLC

(57) ABSTRACT

A mask pattern for semiconductor device fabrication comprises a resist pattern formed on a semiconductor substrate, and an interpolymer complex film formed on the resist pattern, wherein the interpolymer complex film includes a network formed by a hydrogen bond between a proton donor polymer and a proton acceptor polymer.

24 Claims, 11 Drawing Sheets

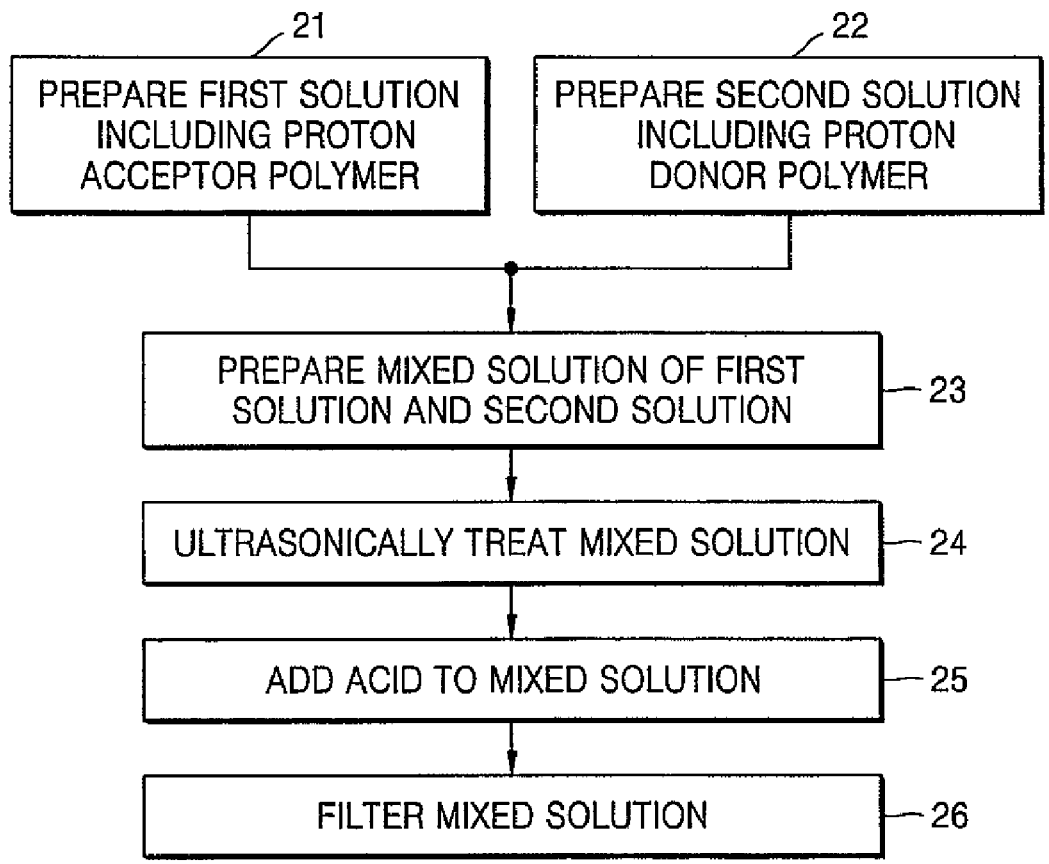
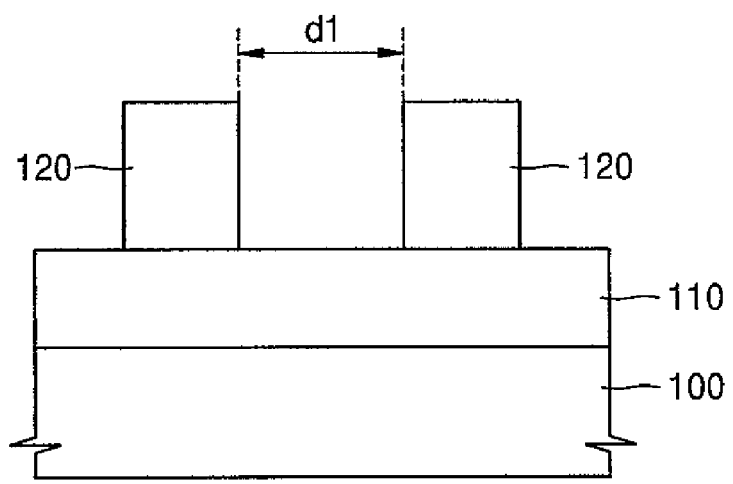

MASK PATTERN FOR SEMICONDUCTOR DEVICE FABRICATION, METHOD OF FORMING THE SAME, METHOD FOR PREPARING COATING, COMPOSITION FOR FINE PATTERN FORMATION, AND METHOD OF FABRICATING SEMICONDUCTOR DEVICE

CROSS-REFERENCE TO RELATED APPLICATION

This application is a continuation of U.S. patent application Ser. No. 10/972,302, filed on Oct. 23, 2004 now U.S. Pat. No. 7,314,691, which in turn claims priority under 35 U.S.C. § 119 to Korean Patent Application Nos. 2004-24021 filed on Apr. 8, 2004 and No. 2004-57163 filed on Jul. 22, 2004, the disclosures of which are each all incorporated herein by reference in their entirety.

BACKGROUND

1. Technical Field

The present invention relates to a coating composition for semiconductor device fabrication, a method of forming a mask pattern, and a method of fabricating a semiconductor device; more particularly, a mask pattern for semiconductor device fabrication, having a fine pattern beyond a wavelength limit of lithography, a method of forming the mask pattern, a coating composition for fine pattern formation, and a method of fabricating a finely patterned semiconductor device using the coating composition.

2. Discussion of Related Art

In a conventional patterning process for semiconductor device fabrication, a photoresist pattern is formed on a certain film to be etched for pattern formation. The certain film such as a silicon film, a dielectric film, or a conductive film, is etched using the photoresist pattern as an etching mask to form a pattern. With the increase of integration of semiconductor devices, the design rule of smaller critical dimension (CD) and lithography technology of forming fine patterns become critical. The fine patterns include contact holes having a smaller opening size or spaces having a smaller width.

In a conventional lithography technology for forming smaller size contact holes, a short-wavelength exposure tool such as an E-beam lithography or a half-tone phase shift mask is used. The short-wavelength exposure tool based lithography is material dependent and uneconomical. The half-tone phase shift mask based lithography is difficult to form contact holes which are less than 150 nm in size.

Various technologies for forming a fine pattern have been suggested. Japanese Patent Publication No. 1989-307228 discloses a technology of forming a resist pattern. A resist pattern formed by exposure and development of a resist film is thermally treated so that the profile shape of the resist pattern is changed. According to this technology, a resist flow rate is different in an upper area and a middle area of the resist pattern. When the CD shrinkage of the resist pattern by thermal flow is 100 nm or more, the profile of the resist pattern is transformed by rapid flow characteristics of the resist film. As a result, a bowing profile is obtained near the middle area. This technology has a limitation in adjusting the flow rate of the resist pattern, which makes it difficult to reduce the CD of the resist pattern while maintaining a vertical profile shape.

Japanese Patent Publication Nos. 1993-241348, 1994-250379, 1998-73927, 1999-204399, 1999-283905, 1999-283910, 2000-58506, 2000-298356, 2001-66782, 2001-228616, 2001-19860, and 2001-109165 disclose a method of forming a resist pattern by a chemical treatment. Japanese Patent Publication No. 2001-228616 discloses a technology of decreasing a hole diameter and an isolation width of a resist pattern by increasing the thickness of the resist pattern. According to this technology, the resist pattern that can serve as an acid donor is coated with a framing material to be cross-linked with the acid. When the acid is transferred from the resist pattern to a layer made of the framing material by heating, a cross-linked layer is formed as a layer covering the resist pattern at an interface between the resist pattern and the framing material layer. However, a chemical cross-linking reaction may also occur at an unwanted area, thereby causing pattern defects. With conventional technology, a precise temperature control to induce a desired chemical cross-linking reaction may be difficult.

Japanese Patent Publication Nos. 2003-107752, 2003-84448, 2003-84459, 2003-84460, 2003-142381, 2003-195527, 2003-202679, 2003-303757, and 2003-316026 disclose a composition for pattern formation and a pattern formation method. Japanese Patent Publication No. 2003-202679 discloses a method of forming patterns using a coating agent. The coating agent is coated on a substrate having photoresist patterns to decrease space between the photoresist patterns by thermal shrinkage effect of the coating agent. Since the thermal shrinkage amount of the coating agent typically depends on the temperature profile of the substrate, it may be difficult to form uniform resist patterns on the whole surface of the substrate. Furthermore, a resist material with a low glass transition temperature needs to be used. In addition, to accurately obtain a certain feature size, a complicated calculation process for correction of iso-dense bias needs to be done.

As described above, among CD reduction technologies that have been suggested hitherto, a resist flow technology by thermal treatment may not provide a good sidewall profile. For example, coating of a separate material on a resist pattern may induce an unwanted cross-linkage in the resist pattern, thereby causing pattern defects. Furthermore, the material remained on an unwanted region may cause various pattern defects after development. When an exposure tool with a wavelength of about 157 nm or about 193 nm is used or when the sizes of holes or trenches to be formed decrease, pattern defects may increase.

In a conventional bi-layer resist (BLR) or multi-layer resist (MLR) process, patterning is performed by photolithography using a silicon-containing resist as a top layer resist. A silicon atom in the silicon-containing resist is converted into glass (i.e., $SiO_x$) by a dry etching method using $O_2$ reactive ion etching (RIE) technology to form a cured layer on a surface of a resist layer. The cured layer formed serves as an etching mask in a subsequent dry etching process. Since the cured layer increases a resistance to the dry etching, a pattern with a high aspect ratio can be formed and a pattern falling phenomenon can be prevented. Thus, a patterning process based on MLR can provide a high-resolution pattern with a high aspect ratio. However, as the content of silicon in a top resist material increases, a top resist layer has poor thermal stability and wettability to a developer.

Furthermore, when a resist flow technology by thermal treatment is applied to a resist pattern made of the top resist material to form a fine pattern, the thickness of the resist pattern decreases, which renders pattern transfer to a bottom resist layer difficult. When a technology of forming a fine pattern using a cross-linked layer as a layer covering a resist pattern is applied to a MLR process, a material used for cross-linkage in a surface of the resist pattern may have insufficient silicon contents. Thus, the cross-linked layer cannot serve as a hard mask during a dry etching by $O_2$ RIE technology. Japanese Patent Publication No. 1999-283910 discloses a silicon-containing resist material. However, this technology involves rinsing with a mixed solution of an organic solvent instead of deionized water, which renders mass production difficult.

SUMMARY OF THE INVENTION

In exemplary embodiments of the present invention, the interpolymer complex film is formed on the surface of the resist pattern to reduce the sizes of openings of a mask pattern. The interpolymer complex film is a water-insoluble film that has a network formed by a hydrogen bond between a proton donor polymer and a proton acceptor polymer. The interpolymer complex film formed on the surface of the resist pattern can form a mask pattern with small-sized openings beyond the wavelength limit of photolithography technology. Furthermore, a vertical sidewall profile of a mask pattern can be maintained unchanged. In addition, iso-dense bias can be minimized upon width reduction of the openings.

According to an exemplary embodiment of the present invention, a mask pattern for semiconductor device fabrication comprises a resist pattern formed on a semiconductor substrate, and an interpolymer complex film formed on the resist pattern, wherein the interpolymer complex film includes a network formed by a hydrogen bond between a proton donor polymer and a proton acceptor polymer.

According to another exemplary embodiment of the present invention, a method of forming a mask pattern for semiconductor device fabrication comprises forming a resist pattern on a substrate, and forming an interpolymer complex film having a network formed by a hydrogen bond between a proton donor polymer and a proton acceptor polymer on a surface of the resist pattern.

According to still another exemplary embodiment of the present invention, a method of forming a mask pattern for semiconductor device fabrication comprises forming a resist pattern on a semiconductor substrate, contacting a coating composition comprising a proton donor polymer and a proton acceptor polymer with a surface of the resist pattern, and forming a water-insoluble interpolymer complex film on the surface of the resist pattern.

According to another exemplary embodiment of the present invention, a method for preparing a coating composition for fine pattern formation comprises preparing a first solution comprising a proton acceptor polymer and a first solvent, preparing a second solution comprising a proton donor polymer and a second solvent, and preparing a mixed solution of the first solution and the second solution.

According to another exemplary embodiment of the present invention, a method of fabricating a semiconductor device comprises forming an underlayer on a semiconductor substrate, forming a resist pattern with openings through which the underlayer is exposed to a first width, forming a water-insoluble interpolymer complex film on a surface of the resist pattern by heating the semiconductor substrate in a state wherein a coating composition comprising a proton donor polymer and a proton acceptor polymer contacts with the surface of the resist pattern, to expose the underlayer through the openings to a second width being smaller than the first width, and etching the underlayer using the resist pattern and the interpolymer complex film as an etching mask. These and other exemplary embodiments, features and advantages of the present invention will become more apparent by describing in detail exemplary embodiments thereof with reference to the attached drawings.

BRIEF DESCRIPTION OF THE DRAWINGS

FIG. 2 is a flowchart that schematically illustrates a method for preparing a coating composition for fine pattern formation according to an exemplary embodiment of the present invention.

FIGS. 3A through 3F are sectional views that illustrate a method of fabricating a semiconductor device according to an exemplary embodiment of the present invention.

DETAILED DESCRIPTION OF EXEMPLARY EMBODIMENTS

Figure 1:
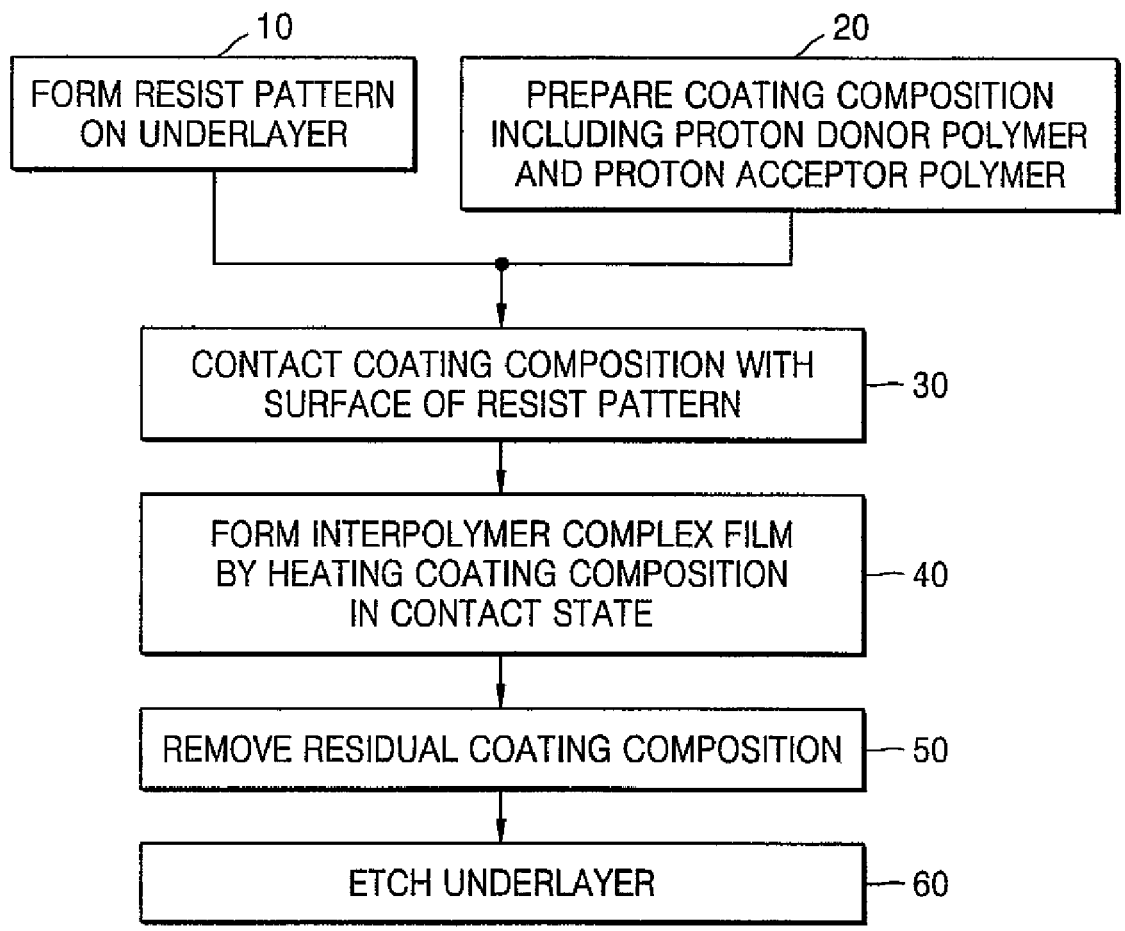
FIG. 1 is a flowchart that schematically illustrates a method of fabricating a semiconductor device according to an exemplary embodiment of the present invention.

Exemplary embodiments of the present invention will now be described more fully with reference to the accompanying drawings. This invention may, however, be embodied in many different forms and should not be construed as being limited to the embodiments set forth herein. Rather, these embodiments are provided so that this disclosure will be through and complete, and will fully convey the concept of the invention to those skilled in the art. A method of fabricating a semiconductor device according to an exemplary embodiment of the present invention will now be described with reference to a flowchart as illustrated in FIG. 1.

Step 10

In step 10, an underlayer to be etched is formed on a semiconductor substrate. The underlayer may be a dielectric film such as a silicon film, an oxide film, a nitride film, or an oxide-nitride film. The underlayer may be a conductive film. To form contact holes in the underlayer, a dielectric film may be used. A resist film is formed on the underlayer. The resist film may be subjected to exposure and development by conventional photolithography. A resist pattern can be formed with openings through which the underlayer is exposed to a certain width.

Step 20

In step 20, a coating composition containing a proton donor polymer and a proton acceptor polymer is prepared. Both of the proton donor polymer and the proton acceptor polymer contained in the coating composition may be water-soluble.

Each of the proton donor polymer and the proton acceptor polymer is used in an amount of about 0.1 to about 5.0 wt %, and preferably about 0.1 to about 2.0 wt %, based on the total weight of the coating composition. The proton donor polymer and the proton acceptor polymer may be mixed at a weight ratio of about 1:9 to about 9:1.

The coating composition further includes a solvent. The coating composition may further include a base, an acid, a surfactant, or a thermal acid generator. The coating composition may further include a silicon-containing material such as a silicon alkoxide monomer, a silicon alkoxide oligomer, or a partially hydrolyzed product thereof.

(1) Proton Donor Polymer

The proton donor polymer includes a monomer repeat unit having a carboxyl group or a sulfonic group. Preferably, the proton donor polymer includes a first repeat unit composed of a maleic acid monomer unit represented by Formula 1 below:

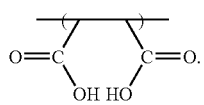

[Formula 1]

The proton donor polymer may further include a second repeat unit composed of a comonomer unit $Z_1$. The comonomer unit $Z_1$ is copolymerized with the maleic acid monomer unit, as represented by Formula 2 below:

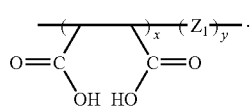

[Formula 2]

The second repeat unit composed of the comonomer unit $Z_1$ may be an acrylic monomer unit, a vinyl monomer unit, an alkyleneglycol monomer unit, an ethyleneimine monomer unit, an oxazoline group-containing monomer unit, an acrylonitrile monomer unit, an allylamide monomer unit, a 3,4-dihydropyrane monomer unit, or a 2,3-dihydrofurane monomer unit. The proton donor polymer may be a copolymer, a terpolymer, a tetrapolymer, or more according to the second repeat unit. That is, the second repeat unit of the proton donor polymer may include two or more different monomer units.

Examples of the acrylic monomer unit constituting the second repeat unit include acrylate, methacrylate, acrylamide, anhydrous maleic acid, N,N-dimethylacrylamide, methacrylamide, N,N-dimethylmethacrylamide, N-isopropylacrylamide, aminopropylacrylamide, aminopropylmethacrylamide, N,N-dimethylaminopropylacrylamide, N,N-dimethylaminopropylmethacrylamide, N-acryloylmorpholine, N-methylacrylamide, diacetonacrylamide, N,N-dimethylaminoethylmethacrylate, N,N-diethylaminoethylmethacrylate, and N,N-dimethylaminoethylacrylate.

Examples of the vinyl monomer unit constituting the second repeat unit include vinylalcohol, vinylacetate, vinylacetal, methylvinylether, ethylvinylether, N-vinylpyrrolidone, N-vinylcaprolactam, vinylimidazolidinone, and vinylsulfonic acid.

Examples of the alkyleneglycol monomer unit constituting the second repeat unit include ethyleneglycol and propyleneglycol.

The second repeat unit may be composed of a hydrophilic monomer unit alone or in combination of a hydrophobic monomer unit. When the second repeat unit includes small amount of a hydrophobic monomer unit, formation of an interpolymer complex film in a subsequent step (step 40 of FIG. 1) can be facilitated. The first repeat unit of the proton donor polymer is used in an amount of about 3 to about 90%, and preferably about 5 to about 50%, based on the total number of repeat units. The proton donor polymer may have an average molecular weight of about 1,000 to 100,000 daltons, preferably about 2,000 to about 50,000 daltons.

(2) Proton Acceptor Polymer

The proton acceptor polymer includes a monomer repeat unit having an amido group.

Preferably, the proton acceptor polymer may include a first repeat unit composed of a vinyl monomer unit represented by Formula 3 below:

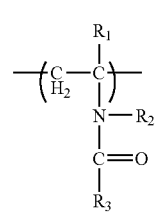

[Formula 3]

$R_1$ is a hydrogen atom or a methyl group. $R_2$ and $R_3$ are a hydrogen atom or an alkyl group of $C_1$ to $C_5$. $R_2$ and $R_3$ can be connected in a form of $-R_2-R_3$.

The proton acceptor polymer may further include a second repeat unit composed of a comonomer unit $Z_2$. The comonomer unit $Z_2$ is copolymerized with the vinyl monomer unit, as represented by Formula 4 below:

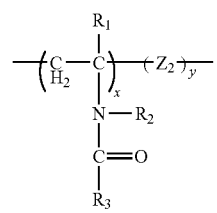

[Formula 4]

$R_1$, $R_2$, and $R_3$ are the same as defined above.

The second repeat unit composed of the comonomer unit $Z_2$ may be an acrylic monomer unit, a vinyl monomer unit, an alkyleneglycol monomer unit, an ethyleneimine monomer unit, an oxazoline group-containing monomer unit, an acrylonitrile monomer unit, an allylamide monomer unit, a 3,4-dihydropyrane monomer unit, or a 2,3-dihydrofurane monomer unit. The proton acceptor polymer may be a copolymer, a terpolymer, a tetrapolymer, or more according to the second repeat unit. That is, the second repeat unit of the proton acceptor polymer may include two or more different monomer units.

Examples of the acrylic monomer unit constituting the second repeat unit include acrylate, methacrylate, maleic acid, anhydrous maleic acid, N,N-dimethylacrylamide, methacrylamide, N,N-dimethylmethacrylamide, N-isopropylacrylamide, aminopropylacrylamide, aminopropylmethacrylamide, N,N-dimethylaminopropylacrylamide, N,N-dimethylaminopropylmethacrylamide, N-acryloylmorpholine, N-methylacrylamide, diacetonacrylamide, N,N-dimethylaminoethylmethacrylate, N,N-diethylaminoethylmethacrylate, and N,N-dimethylaminoethylacrylate.

Examples of the vinyl monomer unit constituting the second repeat unit include vinylalcohol, vinylacetate, vinylacetal, methylvinylether, ethylvinylether, N-vinylpyrrolidone, N-vinylcaprolactam, vinylimidazolidinone, and vinylsulfonic acid.

Examples of the alkyleneglycol monomer unit constituting the second repeat unit include ethyleneglycol and propyleneglycol.

The second repeat unit may be composed of a hydrophilic monomer unit alone or in combination with a hydrophobic monomer unit. When the second repeat unit includes small amount of a hydrophobic monomer unit, formation of an interpolymer complex film in a subsequent step (step 40 of FIG. 1) can be facilitated.

When $R_2$ and $R_3$ are connected in a form of $—R_2—R_3—$, Formula 3 can be replaced with Formula 5 below:

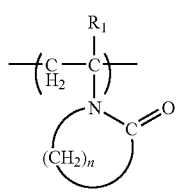

[Formula 5]

N is an integer of 1 to 5.

An example of the proton acceptor polymer having a repeat unit of Formula 5 is a compound including a first repeat unit composed of a vinyl pyrrolidone monomer unit, as represented by the following Formula 6:

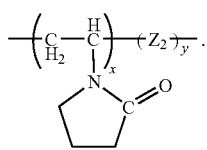

[Formula 6]

Another example of the proton acceptor polymer having the repeat unit of Formula 5 is a compound including a first repeat unit composed of a vinyl caprolactam monomer unit, as represented by the following Formula 7:

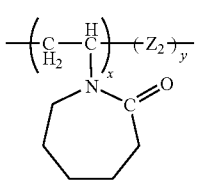

[Formula 7]

Preferably, the proton acceptor polymer may include a first repeat unit composed of a vinyl monomer unit represented by Formula 8 below:

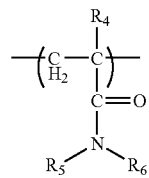

[Formula 8]

$R_4$ is a hydrogen atom or a methyl group. $R_5$ and $R_6$ are a hydrogen atom, a methyl group, an n-propyl group, an i-propyl group, an aminopropyl group, or an N,N-dimethylaminopropyl group.

The proton acceptor polymer may further include a second repeat unit composed of a comonomer unit $Z_3$. The comonomer unit $Z_3$ copolymerized with the vinyl monomer unit of Formula 8, as represented by Formula 9 below:

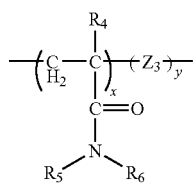

[Formula 9]

wherein, $R_4$, $R_5$, and $R_6$ are the same as defined above.

The above description of the second repeat unit composed of comonomer unit $Z_2$ can also be applied to the second repeat unit composed of comonomer unit $Z_3$.

The first repeat unit may be used in the proton acceptor polymer in an amount of about 3 to about 100%, and preferably about 50 to about 100%, based on the total number of repeat units. Preferably, the proton acceptor polymer has an average molecular weight of about 1,000 to about 100,000 daltons, preferably about 2,000 to about 50,000 daltons.

(3) Base

The base may prevent precipitate formation in the coating composition. The base may be used in an amount of about 0.1 to about 5.0 wt %, and preferably about 0.2 to about 1.0 wt %, based on the total weight of the coating composition. Preferably, the base may be a material with a boiling point of about 140° C. or more. The base in the coating composition may be monoethanolamine, triethanolamine, or tetramethyl ammonium hydroxide (TMAH).

(4) Acid

The coating composition may further include a protonic acid. The protonic acid may be used alone or in combination with the base. When the protonic acid is used in combination with the base, the protonic acid and the base may form a salt. The protonic acid is used in an amount of about 0.1 to about 10 wt %, and preferably about 0.2 to about 1.0 wt %, based on the total weight of the coating composition. The protonic acid may be selected from various materials. The protonic acid may be replaced with a compound generating an acid when heated. An acid in the coating composition may be p-toluenesulfonic acid, trifluoroacetic acid, or dodecylbenzenesulfonic acid.

(5) Surfactant

The surfactant may provide good coverage characteristics when the resist pattern formed in step 10 is coated with the coating composition. The surfactant may be used in an amount of about 0.01 to about 0.5 wt %, based on the total weight of the coating composition. The surfactant may be commercially available "Zonyl-FSN" (DuPont), "Poly-Fox™" (OMNOVA Solutions Inc.), "Fluorad™", (3M), "NONIPORU™", (SANYOKASEI), "MEGAFACE™", (Dainippon Ink & Chemicals), or a mixture thereof.

(6) Thermal Acid Generator

The thermal acid generator may be "CYCAT4040" (Cymel Co.), which is commercially available.

(7) Silicon-containing Material

The coating composition used herein may include a silicon-containing material. The silicon-containing material may be a silicon alkoxide monomer, a silicon alkoxide oligomer, or a partially hydrolyzed product thereof. A silicon-containing material may be water-soluble and non-hydrolyzable. Preferably, a material with a boiling point of about 140° C. or more can be used. The silicon-containing material can be used in an amount of about 0.1 to about 5.0 wt %, and preferably, about 1.0 to about 3.0 wt %, based on the total weight of the coating composition.

Examples of the silicon alkoxide monomer in the coating composition may include tetraethylorthosilicate (TEOS), tetramethoxysilane (TMOS), propylsilicate, butylsilicate, methyltrimethoxysilane, methyltriethoxysilane, dimethyldimethoxysilane, dimethyldiethoxysilane, vinyltrimethoxysilane, vinyltriethoxysilane, vinyltris(2-methoxyethoxy)silane, -(2-aminoethyl)-3-aminopropylmethyldimethoxysilane, N-(2-aminoethyl)-3-aminopropyltriethoxysilane, N-(2-aminoethyl)-3-aminopropyltrimethoxysilane, diethylenetriaminopropyltrimethoxysilane, diethylenetriaminopropyltriethoxysilane, diethylenetriaminopropylmethyldimethoxysilane, diethylenetriaminopropylmethyldiethoxysilane, cyclohexylaminopropyltrimethoxysilane, hexanediaminomethyltrimethoxysilane, anilinomethyltrimethoxysilane, anilinomethyltriethoxysilane, diethylaminomethyltriethoxysilane, (diethylaminomethyl)methyldimethoxysilane, 3-aminopropyltriethoxysilane, 3-aminopropylmethyldiethoxysilane, 3-aminopropyltrimethoxysilane, 3-aminopropylmethyldimethoxysilane, 3-glycidoxypropyltrimethoxysilane, 3-glycidoxypropyltriethoxysilane, 3-glycidoxypropylmethyldiethoxysilane, 3-glycidoxypropylmethyldimethoxysilane, 2-(3,4-epoxycyclohexyl)ethyltrimethoxysilane, 3-methacryloxypropyltrimethoxysilane, 3-methacryloxypropyltriethoxysilane, 3-methacryloxypropylmethyldimethoxysilane, 3-mercaptopropyltrimethoxysilane, 3-mercaptpropylmethyldimethoxysilane, 3-mercaptopropyltriethoxysilane, bis(triethoxysilylpropyl)tetrasulfide, bis(triethoxysilylpropyl)disulfide, 3-thiocyanopropyltriethoxysilane, N-(1,3-dimethylbutylidene)-3-(triethoxysilyl)-1-propaneamine, N-[2-(vinylbenzylamino)ethyl]-3-aminopropyltrimethoxysilane hydrorochloric acid, and N,N'-bis[3-(trimethoxysilyl)propyl] ethylenediamine.

Examples of the silicon alkoxide oligomer in the coating composition include "Silicate40", "Silicate45", and "Silicate48" (Tama Chemicals Co., Ltd.), each of which has a composition of $Si_nO_{n-1}(OC_2H_5)_{2n+2}$, "MSilicate51" (Tama Chemicals Co., Ltd) with a composition of $Si_nO_{n-1}(OCH_3)_{2n+2}$, poly(dimethoxysiloxane), and a hydroxy terminated oligomer with a composition of $Si_nO_{n-1}(OH)_2(OCH_3)_{2n}$.

A partially hydrolyzed product of the above-illustrated silicon alkoxide monomer or oligomer may also be contained in the coating composition. Examples of the partially hydrolyzed product of the silicon alkoxide monomer or oligomer include partially hydrolyzed "Silicate40", "Silicate45", and "Silicate48" ($Si_nO_{n-1}(OH)_x(OC_2H_5)_{2n+2-x}$), a partially hydrolyzed "MSilicate51" ($Si_nO_{n-1}(OH)_x(OCH_3)_{2n+2-x}$), partially hydrolyzed poly(dimethoxysiloxane), and a hydroxy terminated $Si_nO_{n-1}(OH)_{2+x}(OCH_3)_{2n-x}$.

Generally, the partially hydrolyzed product of silicon oxide is chemically unstable compared to its parent compound. Due to high solubility in water, the partially hydrolyzed product can be used as the silicon-containing compound in the coating composition according to an exemplary embodiment of the present invention. An example of the partially hydrolyzed product of silicon oxide may be used in an exemplary embodiment of the present invention is tetraethylorthosilicate (TEOS) partially hydrolyzed in the presence of about 5 ppm TMAH.

(8) Solvent

The solvent used in the coating composition may be deionized water. Alternatively, the solvent may be a mixture of deionized water and an organic solvent. When the solvent is a mixture of deionized water and an organic solvent, the organic solvent may be used in an amount of about 0 to about 20 wt %, based on the total weight of the coating composition. The organic solvent may be alcohols, nitrites, ketones, esters, lactate esters, aromatic hydrocarbons, or amides.

Preferably, the contents of the acid and the base are adjusted so that the lower critical solution temperature (LCST) of the coating composition is about 30 to about 70° C.

(9) Coating Composition

The proton donor polymer may be used as a first polymer. The proton acceptor polymer may be used as a second polymer. The coating composition may further include a third polymer that may perform neither as a proton donor nor as a proton acceptor. The third polymer serves as a binder polymer between the proton donor polymer and the proton acceptor polymer. For example, the third polymer is polyvinylalcohol.

Since there is no particular limitation on an execution sequence of steps 10 and 20, one of the two steps can be performed over the other according to a process design.

Step 30

In step 30, the coating polymer including the proton donor polymer and the proton acceptor polymer contacts with a surface of the resist pattern formed in step 10. Spin coating, puddling, dipping, or spraying may be used for this process.

For example, the contact time may be about 30 to about 90 seconds. The coating composition may be maintained at about 10 to about 30° C. In an exemplary embodiment of the present invention, the room temperature may be used. The contact process is also performed at the same temperature range, i.e. 10 to about 30° C.

In contacting the coating composition with the surface of the resist pattern, the semiconductor substrate may be rotated or fixed according to a contact method. For example, in the case of using spin coating, the semiconductor substrate rotates about its center at a certain speed, such as about 500 to about 3,000 rpm. To perform uniform coating without pattern defects, in an exemplary embodiment of the present invention, a rotation speed of about 1,500 to about 2,000 rpm is used. When puddling or spraying is used, the semiconductor substrate may be fixed.

Step 40

In step 40, the semiconductor substrate may be heated in a state wherein the coating composition contacts with the surface of the resist pattern to form an interpolymer complex film on the surface of the resist pattern. In an exemplary embodiment of the present invention, the semiconductor substrate is heated to a temperature of about 80 to about 160° C. A time required for the heating may be about 60 to about 90 seconds. The interpolymer complex film has a network formed by hydrogen bond between the proton donor polymer and the proton acceptor polymer. The interpolymer complex film is water-insoluble. An acid may be included in the network constituting the interpolymer complex film.

According to an exemplary embodiment of the present invention, an acid in the resist pattern diffuses toward the coating composition contacting the resist pattern and reacts with a base bonded with the proton donor polymer in the coating composition to form a salt. A hydrogen bond is formed between the proton donor polymer and the proton acceptor polymer in the coating composition. According to another exemplary embodiment of the present invention, a base in the coating composition diffuses into the resist pattern to induce a hydrogen bond between the proton donor polymer and the proton acceptor polymer.

Step 50

In step 50, a water-soluble coating composition remained around the interpolymer complex film formed on the surface of the resist pattern is removed. In one exemplary embodiment of the present invention, the coating composition may be removed by rinsing with deionized water. For example, the rinsing may be performed by rotating the semiconductor substrate at a rate of about 500 to about 4,000 rpm for about 30 to about 90 seconds.

When the water-soluble coating composition is removed, the water-insoluble interpolymer complex film is remained on the surface of the resist pattern. The interpolymer complex film may decrease the width of the underlayer exposed through the openings of the resist pattern.

Step 60

In step 60, the underlayer formed on the semiconductor substrate is etched by using the resist pattern and the interpolymer complex film as an etching mask. A fine pattern beyond a wavelength limit of lithography can be obtained.

FIG. 2 is a flowchart that schematically illustrates a method for preparing a coating composition for fine pattern formation according to an exemplary embodiment of the present invention. Steps 21 through 26 of FIG. 2 constitute step 20 of FIG. 1.

Step 21

In step 21, a first solution including a proton acceptor polymer and a first solvent is prepared.

The first solvent may be deionized water, or a mixture of deionized water and an organic solvent.

The first solution may further include a base, a surfactant, a silicon-containing material, or a mixture thereof. The proton acceptor polymer, the first solvent, the base, the surfactant, and the silicon-containing material are described in step 20 of FIG. 1. The first solution may further include a binder polymer that may perform neither as a proton donor nor as an acceptor. For example, polyvinylalcohol can be used as the binder polymer.

Step 22

In step 22, a second solution including a proton donor polymer and a second solvent is prepared. The second solvent may be deionized water, or a mixture of deionized water and an organic solvent.

The proton donor polymer and the second solvent are described in step 20 of FIG. 1.

Since there is no particular limitation on an execution sequence of steps 21 and 22, one of the two steps can be performed over the other according to a process design.

Step 23

In step 23, the first solution and the second solution are mixed to prepare a mixed solution. For this process, the second solution is dropwise added to the first solution. Preferably, the second solution is dropwise added to the first solution with stirring to prevent the formation of an interpolymer complex in the mixed solution.

Step 24

In step 24, the mixed solution of the first solution and the second solution may be ultrasonically treated to completely disperse precipitates or hydrogels that may exist in the mixed solution. The ultrasonic treatment may be omitted Step 25

In step 25, an acid is added to the mixed solution until the mixed solution turns cloudy. The acid is described in step 20 of FIG. 1.

Step 26

In step 26, the mixed solution is filtered to obtain a clean coating composition.

The coating composition may have LCST of about 30 to about 70° C. according to its components. For example, when the coating composition includes a proton donor polymer, a proton acceptor polymer, and a base, i.e., when an acid is not contained in the coating composition, the coating composition has a low LCST. Therefore, even when a temperature of the coating composition is slightly increased, the coating composition turns cloudy. The proton donor polymer and the proton acceptor polymer in the coating composition interact with each other at a temperature higher than the room temperature, thereby forming a water-insoluble interpolymer complex. Maintaining the coating composition at a high temperature may not be preferable since dispersion of precipitates or hydrogels in the coating composition may be difficult. LCST of the coating composition can be controlled by adjusting the contents of the acid or the base in the mixed solution.

FIGS. 3A through 3F are sectional views that illustrate a method of fabricating a semiconductor device using a single layer resist (SLR) according to an exemplary embodiment of the present invention.

Referring to FIG. 3A, an underlayer 110 to be etched to form a certain pattern, for example contact holes or trenches, is formed on a semiconductor substrate 100. The underlayer 110 may be a dielectric film, a conductive film, or a semiconductive film.

A resist pattern 120 is formed on the underlayer 110. The resist pattern 120 is formed with openings through which an upper surface of the underlayer 110 is exposed with a first width d1. The resist pattern 120 may be formed with a plurality openings defining a hole pattern or a plurality of lines defining a line and space pattern. When the resist pattern 120 is formed with a plurality of lines, the first width d1 corresponds to the width of each space between the lines.

The resist pattern 120 may be made of a resist material including a Novolak resin and a diazonaphthoquinone (DNQ)-based compound. The resist pattern 120 may also be formed using a chemically amplified resist composition including a photo-acid generator (PAG). The resist pattern 120 may be formed using a resist composition for g-line, a resist composition for i-line, a resist composition for KrF excimer laser (248 nm wavelength), a resist composition for ArF excimer laser (193 nm wavelength), a resist composition for $F_2$ excimer laser (157 nm wavelength), or a resist composition for e-beam. The resist pattern 120 may also be formed using a positive-type resist composition or a negative-type resist composition.

Figure 3B:
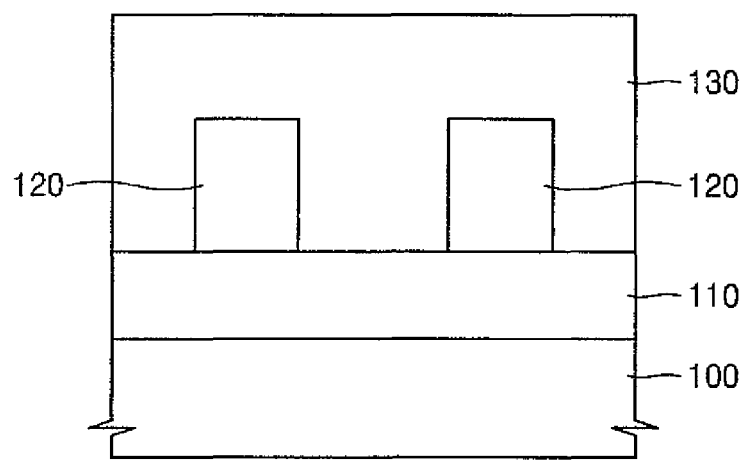

Referring to FIG. 3B, as described above with reference to step 30 of FIG. 1, a coating composition 130 contacts with a surface of the resist pattern 120. In one exemplary embodiment of the present invention, the coating composition 130 is applied on the resist pattern 120 while rotating the semiconductor substrate 100 at a rate of about 500 to about 3,000 rpm for about 30 to about 90 seconds. Preferably, the semiconductor substrate 100 is rotated at a rate of about 1,500 to about 2,000 rpm to uniformly coat the coating composition 130 on the semiconductor substrate 100 without pattern defects.

Figure 3C:
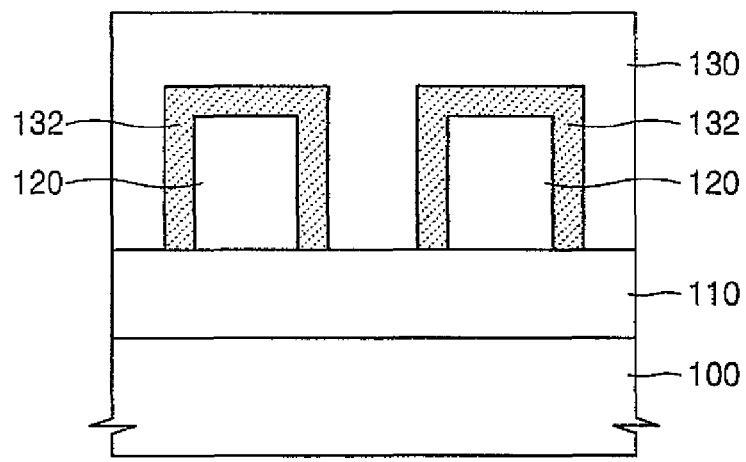

Referring to FIG. 3C, the semiconductor substrate 100 is heated in a state wherein the coating composition 130 contacts with the surface of the resist pattern 120 to form an interpolymer complex film 132 on the surface of the resist pattern 120. The heating may be performed at about 80 to about 160° C. The interpolymer complex film thus formed is water-insoluble. The resist pattern 120 and the interpolymer complex film 132 constitute a mask pattern to be used as an etching mask upon etching the underlayer 110.

Figure 3D:
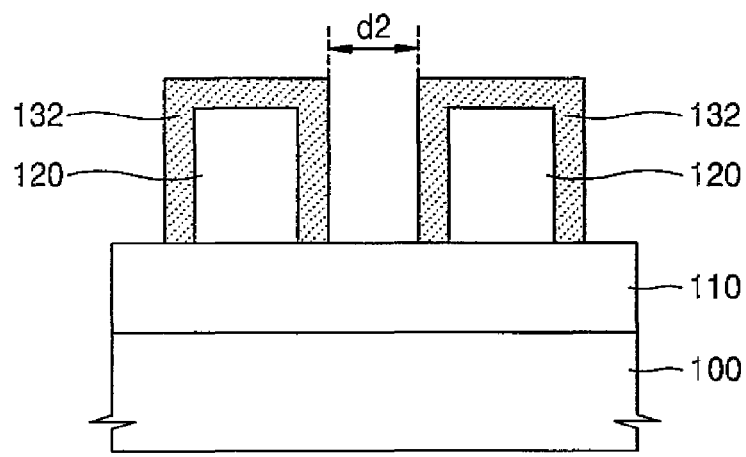
Figure 3E:
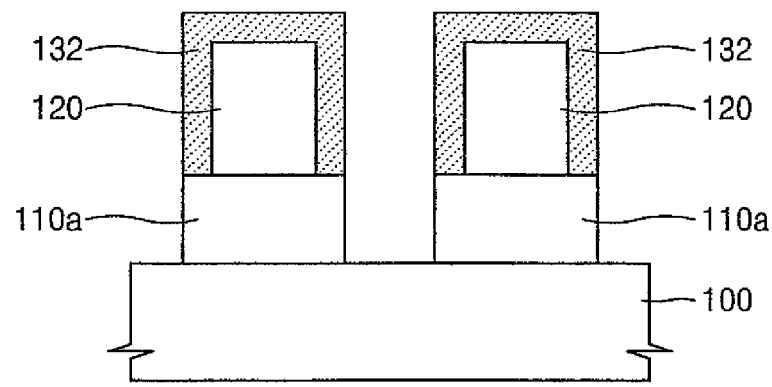

Referring to FIG. 3D, the coating composition 130 remained around the interpolymer complex film 132 is removed. Since the coating composition 130 is water-soluble, it can be removed by rinsing with deionized water. The underlayer 110 is exposed to a second width d2 which is smaller than the first width d1 through the openings of the resist pattern 120. An exposed area of the underlayer 110 is defined by the interpolymer complex film 132 formed on the surface of the resist pattern 120. Referring to FIG. 3E, the underlayer 110 is dry-etched by using the resist pattern 120 and the interpolymer complex film 132 as an etching mask to form an underlayer pattern 110a.

Figure 3F:
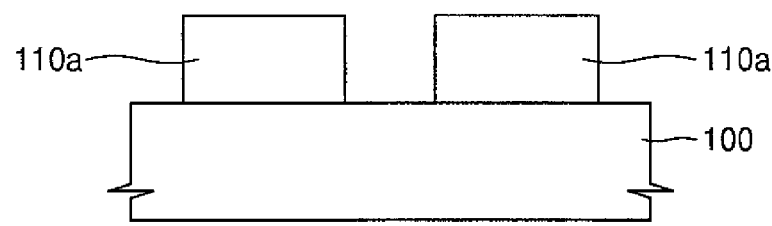

Referring to FIG. 3F, the mask pattern including the resist pattern 120 and the interpolymer complex film 132 is removed.

Figure 4A:
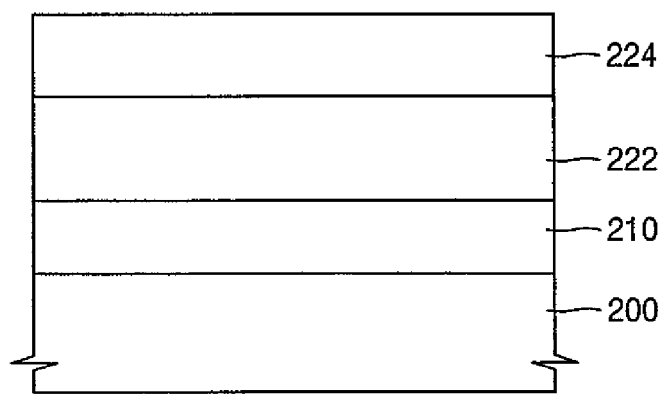
FIGS. 4A through 4H are sectional views that illustrate a method of fabricating a semiconductor device according to another exemplary embodiment of the present invention.

FIGS. 4A through 4F are sectional views that illustrate a method of fabricating a semiconductor device using a bi-layer resist (BLR) according to another exemplary embodiment of the present invention Referring to FIG. 4A, an underlayer 210 to be etched is formed on a semiconductor substrate 200 for forming contact holes or trenches. The underlayer 210 may be a dielectric film, a conductive film, or a semiconductive film.

A bottom layer resist film 222 is formed on the underlayer 210. The bottom layer resist film 222 may be an organic hard mask made of poly(arylene ether), or amorphous carbon.

A resist composition may be spin-coated on the bottom layer resist film 222 to form a top layer resist film 224. The resist composition used to form the top layer resist film 224 may be a silicon-containing resist composition or a silicon-free resist composition.

Figure 4B:
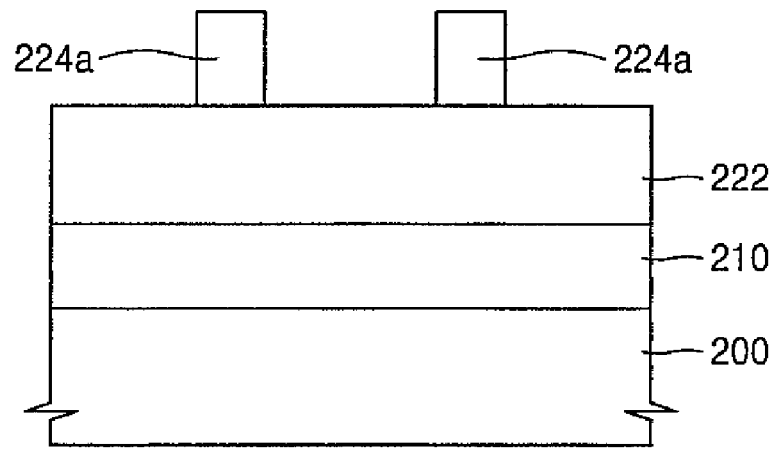
Figure 4C:
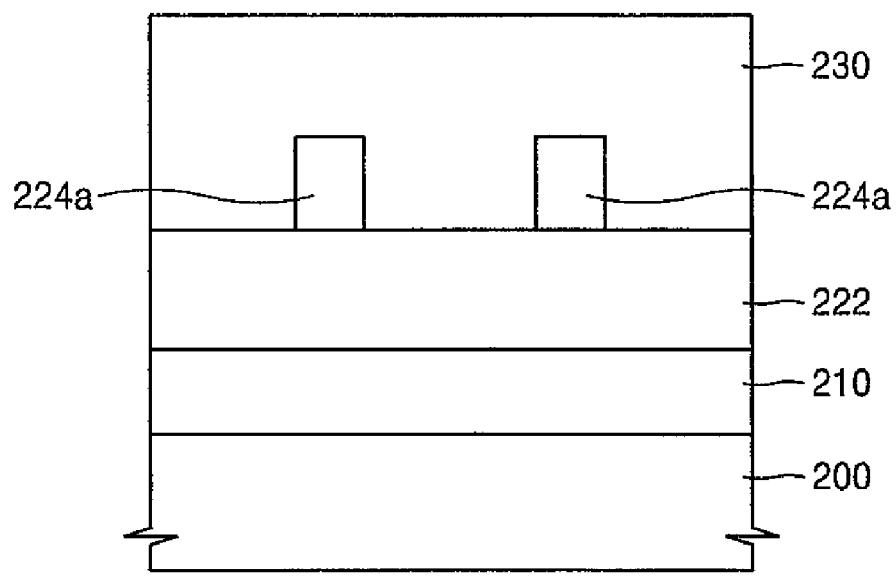

Referring to FIG. 4B, the top layer resist film 224 is subjected to exposure and development to form a top resist pattern 224a. Referring to FIG. 4C, as described above with reference to FIG. 3B, a coating composition 230 is applied on the top resist pattern 224a. The coating composition 230 includes a silicon-containing material as described in step 20 of FIG. 1.

Figure 4D:
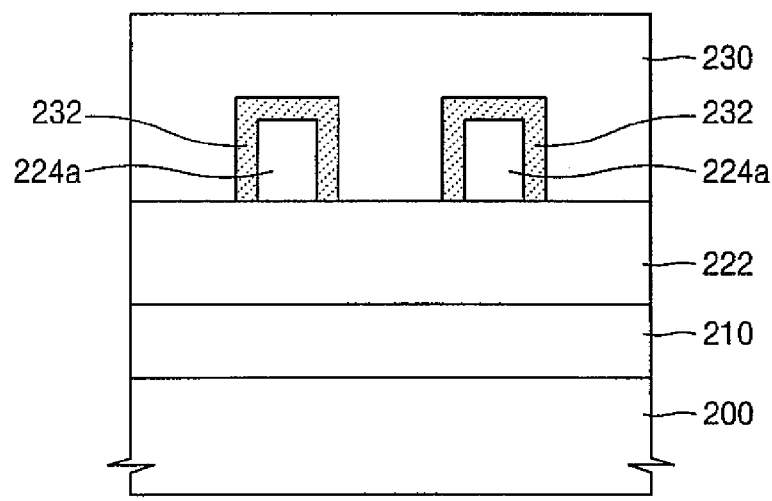

Referring to FIG. 4D, as described above with reference to FIG. 3C, the semiconductor substrate 200 is heated in a state wherein the coating composition 230 contacts with a surface of the top resist pattern 224a to form an interpolymer complex film 232 on the surface of the top resist pattern 224a.

Figure 4E:
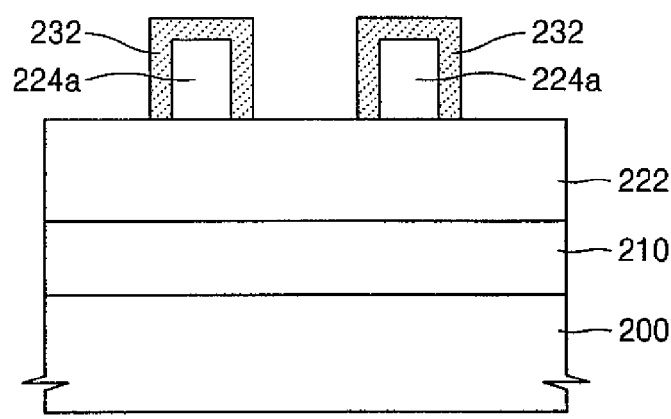

Referring to FIG. 4E, as described above with reference to FIG. 3D, the coating composition 230 remained around the interpolymer complex film 232 is removed.

Figure 4F:
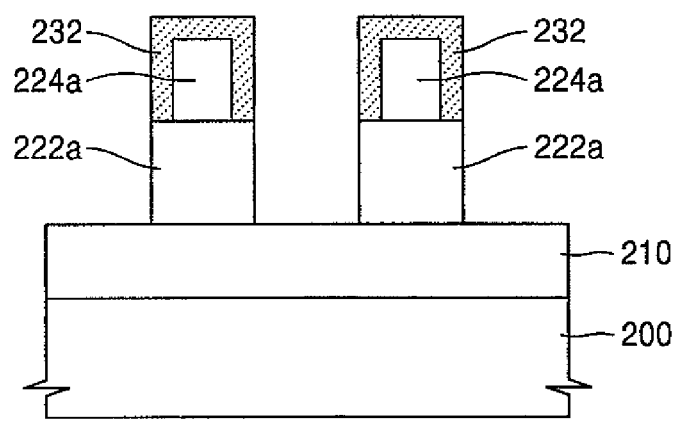

Referring to FIG. 4F, the bottom layer resist film 222 is dry-etched using a mask pattern composed of the top resist pattern 224a and the interpolymer complex film 232 as an etching mask to form a bottom resist pattern 222a. Portions of the top resist pattern 224a and the interpolymer complex film 232 may be worn.

Figure 4G:
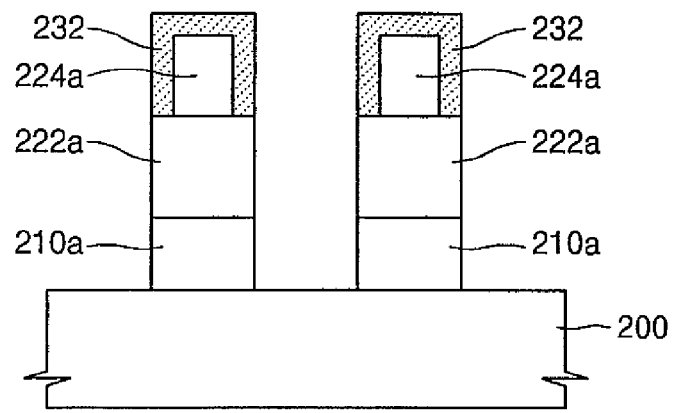

Referring to FIG. 4G, the underlayer 210 is dry-etched using the mask pattern including the top resist pattern 224a and the interpolymer complex film 232 and the underlying bottom resist pattern 222a as an etching mask to form an underlayer pattern 210a.

Figure 4H:
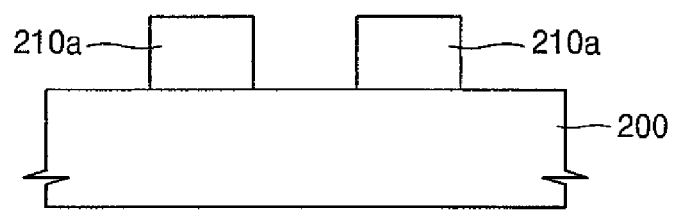

Referring to FIG. 4H, the mask pattern including the top resist pattern 224a and the interpolymer complex film 232, and the bottom resist pattern 222a are removed.

As described above according to the another embodiment of the present invention, in the patterning process using BLR, the interpolymer complex film 232 is formed using the coating composition 230 including a silicon-containing material. The silicon-containing material increases the content of silicon in the etching mask upon etching the bottom layer resist film 222, thereby ensuring a resistance to the dry etching of the bottom layer resist film 222.

In another exemplary embodiment of the present invention, multi-layer resist (MLR) process in which the underlayer 210 is patterned after forming an interlayer oxide film between the bottom layer resist film 222 and the top layer resist film 224 can be used.

Figure 5:
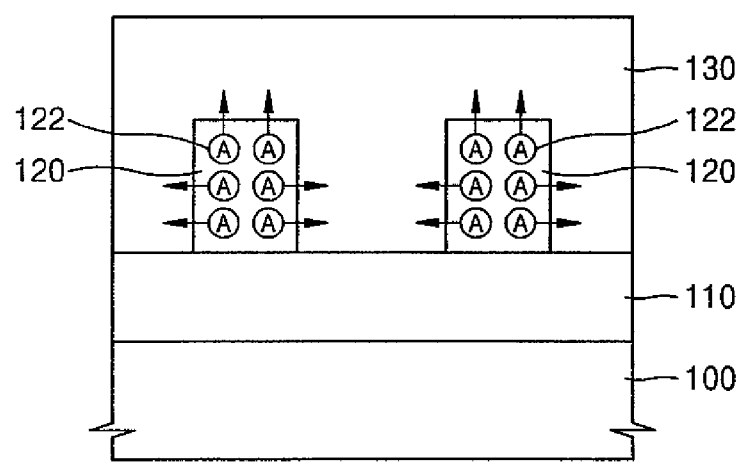
FIG. 5 is a sectional view that illustrates a mechanism of interpolymer complex film formation in a mask pattern formation method according to an exemplary embodiment of the present invention.
Figure 6:
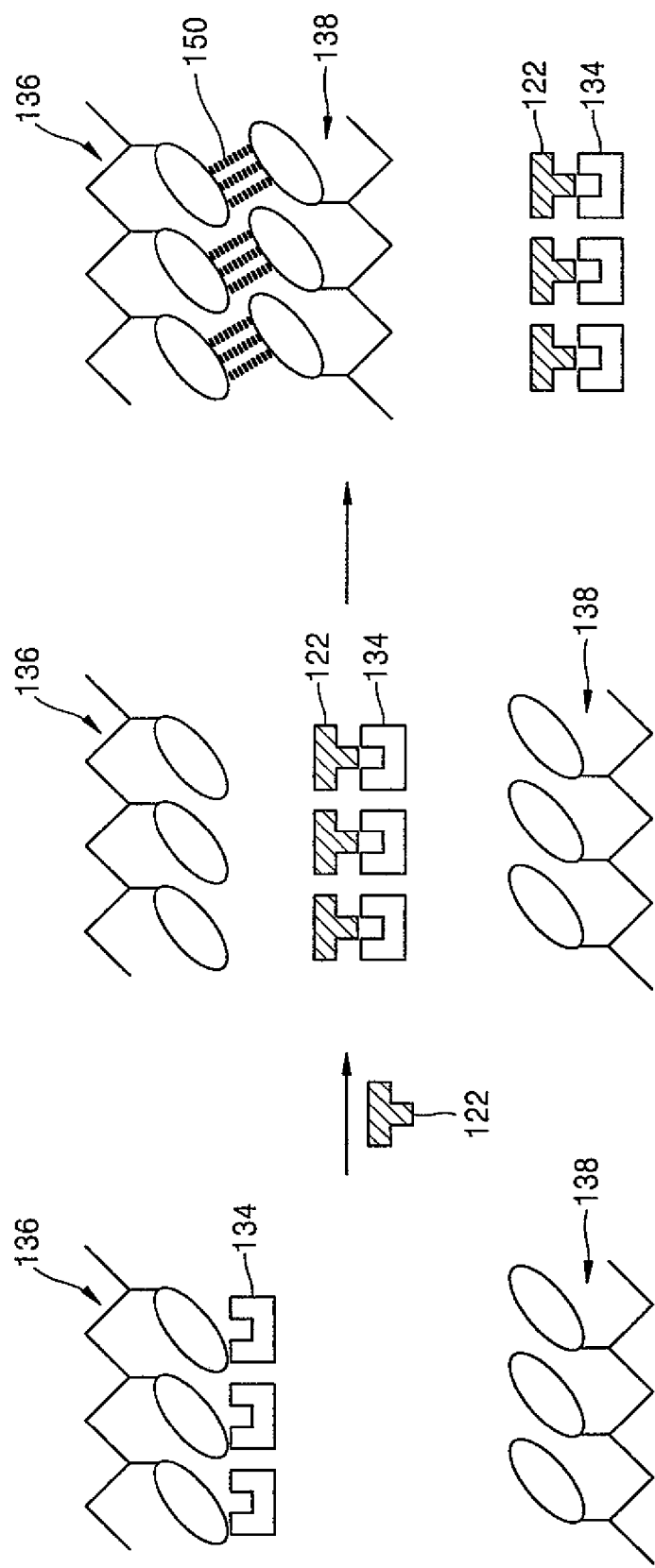
FIG. 6 is a diagram that illustrates an example of an interpolymer complex film formation process according to the mechanism of FIG. 5.

FIGS. 5 and 6 are diagrams that illustrate mechanisms of forming the interpolymer complex films 132 and 232 during the heating process as described above with reference to FIGS. 3C and 4D. A mechanism of forming the interpolymer complex film 232 is substantially similar to that of forming the interpolymer complex film 132.

A mechanism of forming the interpolymer complex film 132 (see FIG. 3C) by heating when the coating composition 130 contacts with the surface of the resist pattern 120 will be described with reference to FIGS. 5 and 6. An acid 122 present in the resist pattern 120 diffuses toward the coating composition 130 contacting with the resist pattern 120 and reacts with a base 134 bonded to a proton donor polymer 136 in the coating composition 130 to form a salt. A hydrogen bond 150 is formed between the proton donor polymer 136 and a proton acceptor polymer 138 in the coating composition 130. As a result, a water-insoluble interpolymer complex is formed.

The above-described mechanism can be applied when the coating composition 130 includes the proton donor polymer 136, the proton acceptor polymer 138, a base, and deionized water.

Figure 7:
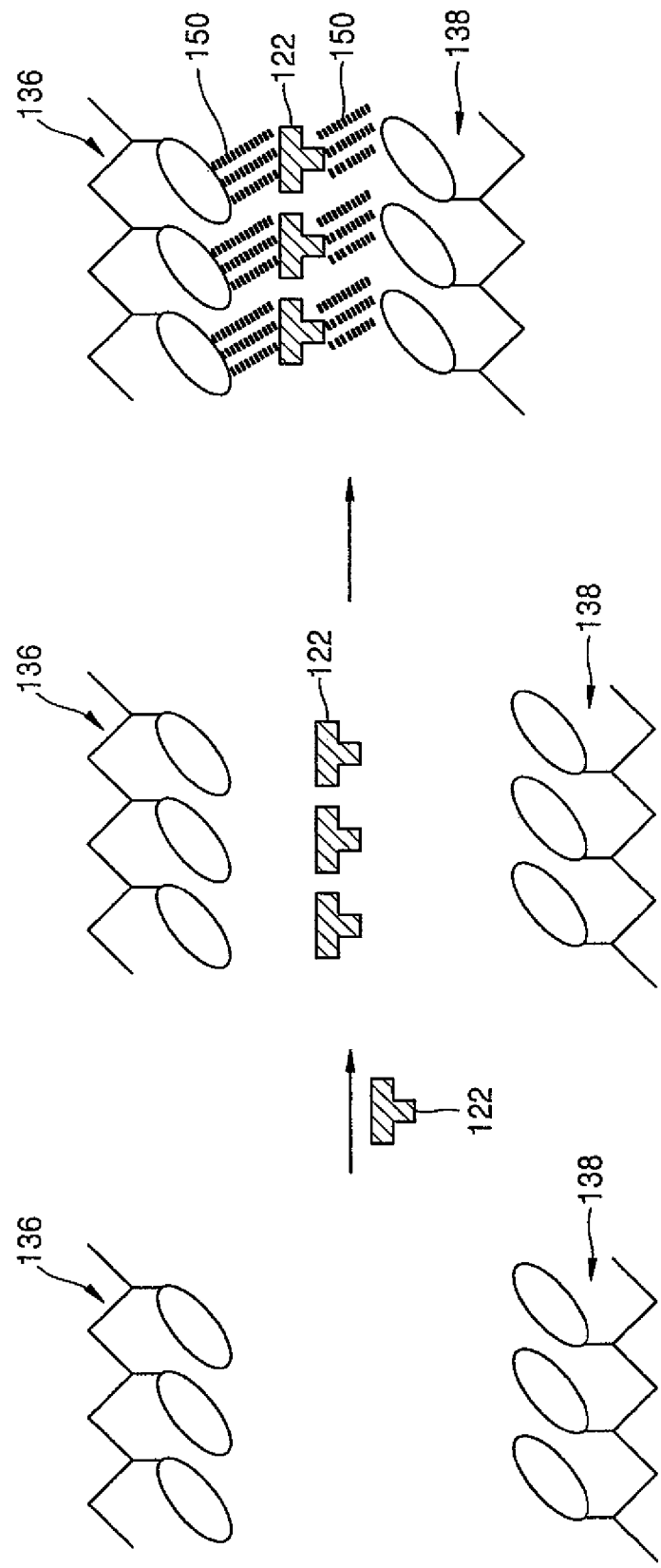
FIG. 7 is a diagram that illustrates another example of an interpolymer complex film formation process according to the mechanism of FIG. 5.

FIG. 7 is a diagram that illustrates another mechanism of forming the interpolymer complex film 132 during the heating process as described above with reference to FIG. 3C.

The mechanism illustrated in FIG. 7 is similar to that illustrated in FIGS. 5 and 6 in that the acid 122 in the resist pattern 120 diffuses toward the coating composition 130 contacting with the resist pattern 120. The mechanism illustrated in FIG. 7 can be applied when a base is not used. Thus, the coating composition 130 includes the proton donor polymer 136, the proton acceptor polymer 138, the acid 122, and deionized water.

When heating is performed in a state wherein the coating composition 130 contacts with the surface of the resist pattern 120, an acid 122 accelerates hydrogen bonding between the proton donor polymer 136 and the proton acceptor polymer 138 in the coating composition 130 to form an interpolymer complex. The acid 122 diffuses from the resist pattern 120 toward the coating composition 130. Alternatively, the acid 122 is present in the coating composition. Therefore, formation of the interpolymer complex which is water-insoluble is facilitated. A network formed by a hydrogen bond 150 in the interpolymer complex film 132 (see FIG. 3C) may contain the acid 122.

Figure 8:
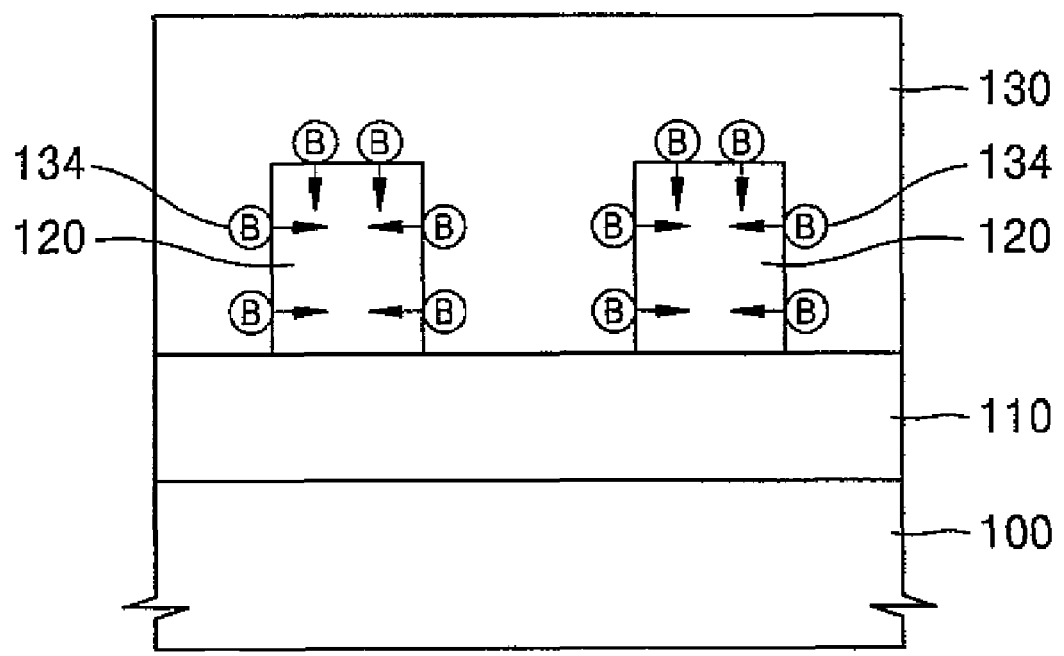
FIG. 8 is a sectional view that illustrates a mechanism of interpolymer complex film formation in a mask pattern formation method according to another exemplary embodiment of the present invention.
Figure 9:
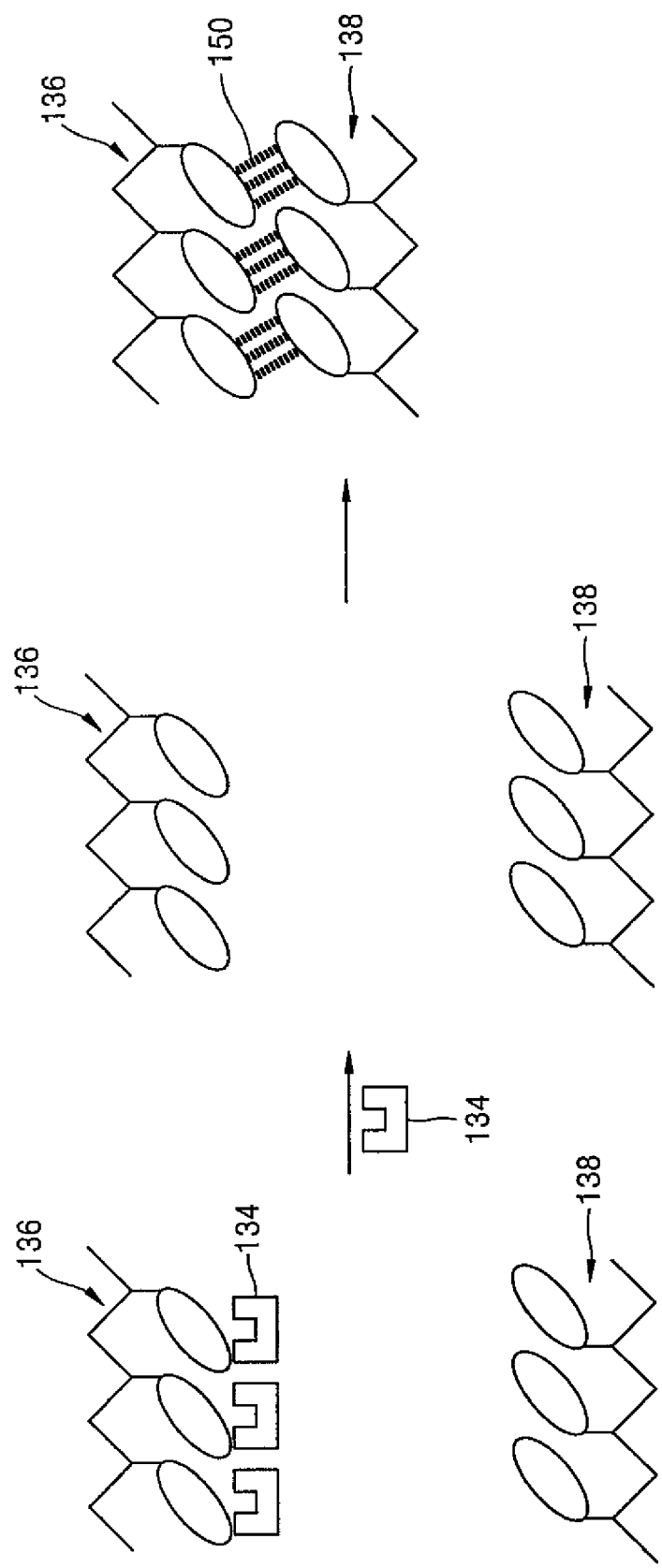
FIG. 9 is a diagram that illustrates an interpolymer complex film formation process according to the mechanism of FIG. 8.

FIGS. 8 and 9 are diagrams that illustrate another mechanism of forming the interpolymer complex film according to an exemplary embodiment of the present invention.

Referring to FIGS. 8 and 9, when the heating is performed in a state wherein the coating composition 130 contacts with the surface of the resist pattern 120, a base 134 in the coating composition 130 diffuses into the resist pattern 120. As a result, a hydrogen bond 150 is formed between a proton donor polymer 136 and a proton acceptor polymer 138 in the coating composition 130, thereby forming a water-insoluble interpolymer complex.

The mechanism illustrated in FIGS. 8 and 9 can be applied when the coating composition 130 includes the proton donor polymer 136, the proton acceptor polymer 138, a base 134, and deionized water.

Hereinafter, illustrative examples of mask patterns formed according to a mask pattern formation method for semiconductor device fabrication according to exemplary embodiments of the present invention will be described.

EXAMPLE 1

Step 1-1

Formation of Resist Pattern

An antireflective film (for example, DUV-30, Nissan Chemical Industries, Ltd.) is formed to a thickness of about 360° C. on an 8-inch bare silicon wafer. Then, a photoresist for ArF (for example, SAIL-G24c, ShinEtsu Chemical Co. Ltd) is spin-coated on the antireflective film followed by baking at about 105° C. for about 60 seconds to form a resist film with a thickness of about 3,000 Å. The resist film is exposed to light by an ArF (wavelength of 193 nm) stepper followed by post-exposure baking (PEB) at about 105° C. for about 60 seconds. Then, the wafer is developed using a 2.38 wt % tetramethylammonium hydroxide (TMAH) solution to form a resist pattern having a plurality of openings on the wafer. The resist pattern has an isolated hole pattern (hereinafter, referred to as "i-hole pattern") with a diameter of about 129.7 nm. The resist pattern also has a dense hole pattern (hereinafter, referred to as "d-hole pattern") with a diameter of about 138.0 nm at a center portion of a hole array in which a plurality of holes are patterned at a pitch of about 240 nm.

Step 1-2

Preparation of Coating Composition

A solution of about 6.0 mg of triethanolamine in about 594 mg $H_2O$ (deionized water) is added to a solution of about 50 mg of poly(vinylpyrrolidone) in about 450 mg $H_2O$ to obtain a mixed solution. About 400 mg $H_2O$ is further added thereto to obtain a diluted mixed solution. A solution of about 50 mg of poly(acrylic acid-co-maleic acid)) in about 450 mg $H_2O$ is dropwise added to the diluted mixed solution with stirring. Some of precipitates and hydrogels created during the dropwise adding can be dispersed by ultrasonic treatment. About 1% aqueous solution of p-toluene sulfonic acid monohydrate is dropwise added until the resultant mixed solution turned cloudy. The resultant thus obtained may be filtered to provide a clean coating composition.

Step 1-3

Formation of Interpolymer Complex Film

The coating composition obtained in step 1-2 is spin-coated on the resist pattern formed in step 1-1 to form a uniform film. The uniform film is baked at about 155° C. for about 60 seconds and rinsed with deionized water. As a result, a water-insoluble interpolymer complex film is uniformly formed on the surface of the resist pattern. The i-hole pattern and the d-hole pattern have a diameter of about 92.3 nm and about 118.7 nm, respectively.

EXAMPLE 2

Step 2-1

Preparation of Coating Composition

A solution of about 20.0 mg of TMAH in about 2,480 mg $H_2O$ is added to a solution of about 200 mg of poly(vinylpyrrolidone) in about 1,800 mg $H_2O$ to obtain a mixed solution. About 1,500 mg $H_2O$ is further added to obtain a diluted mixed solution. A solution of about 200 mg of poly(acrylic acid) in about 1,800 mg $H_2O$ is dropwise added to the diluted mixed solution with stirring. Some precipitates and hydrogels created during the dropwise adding may be dispersed by ultrasonic treatment. About 1% aqueous solution of p-toluene sulfonic acid monohydrate is dropwise added until the resultant mixed solution turned cloudy. The resultant thus obtained is filtered to provide a clean coating composition.

Step 2-2

Formation of Interpolymer Complex Film

The coating composition obtained in step 2-1 is spin-coated on a resist pattern formed in substantially similar manner to step 1-1 of Example 1 to form a uniform film. The uniform film is baked at about 155° C. for about 60 seconds and rinsed with deionized water. As a result, a water-insoluble interpolymer complex film is uniformly formed on the surface of the resist pattern. An i-hole pattern and a d-hole pattern have a diameter of about 113.8 nm and about 129.5 nm, respectively.

EXAMPLE 3

Step 3-1

Preparation of Coating Composition

A solution of about 32.0 mg of TMAH in about 3,968 mg $H_2O$ and a solution of about 32 mg of a thermal acid generator (for example, trade name: CYCAT4040, Cymel Co.) in about 47 mg of isopropylalcohol are added to a solution of about 200 mg of poly(vinylpyrrolidone) in about 1,800 mg $H_2O$ to obtain a mixed solution. A solution of about 200 mg of poly(acrylic acid) in about 1,800 mg $H_2O$ is dropwise added to the mixed solution with stirring. The resultant mixed solution is filtered to provide a clean coating composition.

Step 3-2

Formation of Interpolymer Complex Film

The coating composition obtained in step 3-1 is spin-coated on a resist pattern formed in substantially similar manner to step 1-1 of Example 1 to form a uniform film. The uniform film is baked at about 155° C. for about 60 seconds and rinsed with deionized water. As a result, a water-insoluble interpolymer complex film is uniformly formed on the surface of the resist pattern. An i-hole pattern and a d-hole pattern have a diameter of about 111.6 nm and about 138.4 nm, respectively.

EXAMPLE 4

This Example is performed in a similar manner to Example 1 except that a coating composition contained a surfactant, but not an acid.

Step 4-1

Preparation of Coating Composition

A solution of about 30 mg of triethanolamine in about 2,970 mg $H_2O$, a solution of about 4.0 mg of a surfactant (for example, trade name: Zonyl-FSN, DuPont) in about 396 mg $H_2O$, and about 600 mg $H_2O$ are added to a solution of about 100 mg of poly(vinylpyrrolidone) in about 900 mg $H_2O$ to obtain a mixed solution. A solution of about 100 mg of poly (acrylic acid-co-maleic acid) in about 900 mg $H_2O$ is dropwise added to the mixed solution with stirring. The resultant mixed solution is filtered to provide a clean coating composition. LCST of the obtained coating composition is about 36° C.

Step 4-2

Formation of Interpolymer Complex Film

The coating composition obtained in step 4-1 is spin-coated on a resist pattern formed in substantially same manner to step 1-1 of Example 1 to form a uniform film. The uniform film thus formed may be classified into four sample groups. The four sample groups are respectively baked at about 140° C., 145° C., 150° C., or 153° C. for about 60 seconds, and rinsed with deionized water. A water-insoluble interpolymer complex film is uniformly formed on each surface of the four sample groups. An i-hole pattern and a d-hole pattern have respectively a diameter of about 99.0 nm and about 114.5 nm for the sample group baked at about 140° C., about 105.1 nm and about 118.3 nm for the sample group baked at about 145° C., about 72.1 nm and about 117.2 nm for the sample group baked at about 150° C., and about 61.3 nm and about 100.5 nm for the sample group baked at about 153° C.

EXAMPLE 5

Step 5-1

Preparation of Coating Composition

A solution of about 30 mg of triethanolamine in about 2,970 mg $H_2O$ and a solution of about 4.0 mg of a surfactant (trade name: PolyFox, OMNOVA Solutions Inc.) in about 396 mg $H_2O$ are added to a solution of about 100 mg of poly(vinylpyrrolidone) in about 900 mg $H_2O$ to obtain a mixed solution. A solution of about 100 mg of poly (acrylic acid-co-maleic acid) in about 900 mg $H_2O$ is dropwise added to the mixed solution with stirring. The resultant mixed solution is filtered to provide a clean coating composition.

Step 5-2

Formation of Interpolymer Complex Film

The coating composition obtained in step 5-1 is spin-coated on a resist pattern formed in substantially similar manner to step 1-1 of Example 1 to form a uniform film. The uniform film is baked at about 153° C. for about 60 seconds and rinsed with deionized water. A water-insoluble interpolymer complex film is uniformly formed on the surface of the resist pattern. An i-hole pattern is in a "not-open" state and a d-hole pattern has a diameter of about 74.2 nm.

EXAMPLE 6

Step 6-1

Preparation of Coating Composition

A solution of about 35.0 mg of triethanolamine in about 3,465 mg $H_2O$, a solution of about 4.0 mg of a surfactant (trade name: Zonyl-FSN, DuPont) in about 396 mg $H_2O$, and about 100 mg $H_2O$ are added to a solution of about 100 mg of poly(vinylpyrrolidone) in about 900 mg $H_2O$ to obtain a mixed solution. A solution of about 100 mg of poly (acrylic acid-co-maleic acid) in about 900 mg $H_2O$ is dropwise added to the mixed solution with stirring. The resultant mixed solution is filtered to give a clean coating composition.

Step 6-2

Formation of Interpolymer Complex Film

The coating composition obtained in step 6-1 is spin-coated on a resist pattern formed in substantially similar manner to step 1-1 of Example 1 to form a uniform film. The uniform film is baked at about 145° C. for about 60 seconds and rinsed with deionized water. A water-insoluble interpolymer complex film is uniformly formed on the surface of the resist pattern. An i-hole pattern and a d-hole pattern has a diameter of about 73.8 nm and about 115.3 nm, respectively.

EXAMPLE 7

Step 7-1

Preparation of Coating Composition

A solution of about 16.0 mg of monoethanolamine in about 1,584 mg $H_2O$, a solution of about 4.0 mg of a surfactant (trade name: Zonyl-FSN, DuPont) in about 396 mg $H_2O$, and about 2.0 g $H_2O$ are added to a solution of about 100 mg of poly(vinylpyrrolidone) in about 900 mg $H_2O$ to obtain a mixed solution. A solution of about 100 mg of poly(acrylic acid-co-maleic acid) in about 900 mg $H_2O$ is dropwise added to the mixed solution with stirring. The resultant mixed solution is filtered to give a clean coating composition.

Step 7-2

Formation of Interpolymer Complex Film

The coating composition obtained in step 7-1 is spin-coated on a resist pattern formed in substantially similar manner to step 1-1 of Example 1 to form a uniform film. The uniform film is baked at about 145° C. for about 60 seconds and rinsed with deionized water. A water-insoluble interpolymer complex film is uniformly formed on the surface of the resist pattern. An i-hole pattern and a d-hole pattern have a diameter of about 89.7 nm and about 113.5 nm, respectively.

EXAMPLE 8

Step 8-1

Preparation of Coating Composition

A solution of about 32.0 mg of triethanolamine in about 3,168 mg $H_2O$, a solution of about 4.0 mg of a surfactant (trade name: Zonyl-FSN, DuPont) in about 396 mg $H_2O$, and about 6.4 g $H_2O$ are added to a solution of about 150 mg of poly (vinylpyrrolidone-co-vinylcaprolactam) (vinylpyrrolidone:vinylcaprolactam=50:50) in about 1,350 mg $H_2O$ to obtain a mixed solution. A solution of about 50 mg of poly (acrylic acid-co-maleic acid) in about 450 mg $H_2O$ is dropwise added to the mixed solution with stirring.

The resultant mixed solution is filtered to provide a clean coating composition. In the obtained coating composition, a weight ratio of a proton donor polymer and a proton acceptor polymer is about 1:3.

Step 8-2

Formation of Interpolymer Complex Film

The coating composition obtained in step 8-1 is spin-coated on a resist pattern formed in substantially similar manner to step 1-1 of Example 1 to form a uniform film. The uniform film is baked at about 145° C. for about 60 seconds and rinsed with deionized water. A water-insoluble interpolymer complex film is uniformly formed on the surface of the resist pattern. An i-hole pattern and a d-hole pattern have a diameter of about 91.4 nm and about 98.4 nm, respectively.

EXAMPLE 9

A coating composition prepared in this Example includes polyvinylalcohol used as a binder polymer, in addition to a proton donor polymer and a proton acceptor polymer.

Step 9-1

Preparation of Coating Composition

A solution of about 4 mg of triethanolamine in about 396 mg $H_2O$, a solution of about 4.0 mg of a surfactant (trade name: Zonyl-FSN, DuPont) in about 396 mg $H_2O$, a solution of about 5 mg of poly(vinylpyrrolidone-co-vinylcaprolactam) (vinylpyrrolidone:vinylcaprolactam=50:50) in about 45 mg $H_2O$, and about 7.3 g $H_2O$ are added to a solution of about 190 mg of polyvinylalcohol in about 3,610 mg $H_2O$ to obtain a mixed solution. A solution of about 5.0 mg of poly(acrylic acid-co-maleic acid) in about 45 mg $H_2O$ is dropwise added to the mixed solution with stirring. The resultant mixed solution is filtered to provide a clean coating composition.

Step 9-2

Formation of Interpolymer Complex Film

The coating composition obtained in step 9-1 is spin-coated on a resist pattern formed in substantially similar manner as in step 1-1 of Example 1 to form a uniform film. The uniform film is baked at about 145° C. for about 60 seconds and rinsed with deionized water. A water-insoluble interpolymer complex film is uniformly formed on the surface of the resist pattern. An i-hole pattern and a d-hole pattern have a diameter of about 83.9 nm and about 124.4 nm, respectively.

EXAMPLE 10

Step 10-1

Preparation of Coating Composition

A solution of about 157 mg of triethanolamine in about 156 mg $H_2O$, a solution of about 16 mg of a surfactant (trade name: Zonyl-FSN, DuPont) in about 1,584 mg $H_2O$, and about 14.1 g $H_2O$ are added to a solution of about 400 mg of poly (vinylpyrrolidone-co-vinylcaprolactam) (vinylpyrrolidone:vinylcaprolactam=50:50) in about 3.6 g $H_2O$ to obtain a mixed solution. A solution of about 400 mg of poly(acrylic acid-co-maleic acid) in about 3.9 g $H_2O$ is dropwise added to the mixed solution with stirring. The resultant mixed solution is filtered to provide a clean coating composition.

Step 10-2

Formation of Interpolymer Complex Film

The coating composition obtained in step 10-1 is spin-coated on a resist pattern formed in substantially similar manner to step 1-1 of Example 1 to form a uniform film. The uniform film is baked at about 145° C. for about 60 seconds and rinsed with deionized water. A water-insoluble interpolymer complex film is uniformly formed on the surface of the resist pattern. An i-hole pattern and a d-hole pattern have a diameter of about 88.0 nm and about 115.8 nm, respectively.

EXAMPLE 11

A coating composition prepared in this Example includes an acid but not a base. Polyacrylamide having the structure represented by Formula 9 is used as a proton acceptor polymer.

Step 11-1

Preparation of Coating Composition

A solution of about 10 mg of p-toluenesulfonic acid monohydrate in about 990 mg $H_2O$ is added to a solution of about 50 mg of polyacrylamide in about 450 mg $H_2O$ to obtain a mixed solution. A solution of about 50 mg of poly(acrylic acid-co-maleic acid) in about 450 mg $H_2O$ is dropwise added to the mixed solution with stirring. The resultant mixed solution is filtered to provide a clean coating composition.

Step 11-2

Formation of Interpolymer Complex Film

The coating composition obtained in step 11-1 is spin-coated on a resist pattern formed in substantially similar manner to step 1-1 of Example 1 to form a uniform film. The uniform film is baked at about 155° C. for about 60 seconds and rinsed with deionized water. A water-insoluble interpolymer complex film is uniformly formed on the surface of the resist pattern.

An i-hole pattern and a d-hole pattern have a diameter of about 113.9 nm and about 136.4 nm, respectively.

EXAMPLE 12

A coating composition prepared in this Example includes an acid but not a base.

Step 12-1

Preparation of Coating Composition

A solution of about 17 mg of p-toluenesulfonic acid monohydrate in about 693 mg $H_2O$ and about 3.3 g $H_2O$ are added to a solution of about 100 mg of polyvinylpyrrolidone in about 900 mg $H_2O$ to obtain a mixed solution. A solution of about 100 mg of poly(methylvinylester-alt-maleic acid) in about 900 mg $H_2O$ is dropwise added to the mixed solution with stirring. The resultant mixed solution is filtered to provide a clean coating composition.

Step 12-2

Formation of Interpolymer Complex Film

The coating composition obtained in step 12-1 is spin-coated on a resist pattern formed in substantially similar manner as in step 1-1 of Example 1 to form a uniform film. The uniform film is baked at about 153° C. for about 60 seconds and rinsed with deionized water. A water-insoluble interpolymer complex film is uniformly formed on the surface of the resist pattern. An i-hole pattern and a d-hole pattern have a diameter of about 99.0 nm and about 126.4 nm, respectively.

EXAMPLE 13

A coating composition prepared in this Example contained an acid but not a base.

Step 13-1

Preparation of Coating Composition

A solution of about 40 mg of p-toluenesulfonic acid monohydrate in about 3,960 mg $H_2O$ is added to a solution of about 100 mg of poly(vinylpyrrolidone-co-vinylcaprolactam) (vinylpyrrolidone:vinylcaprolactam=50:50) in about 900 mg $H_2O$ to obtain a mixed solution. A solution of about 100 mg of poly (2,3-dihydrofurane-alt-maleic acid) in about 900 mg $H_2O$ is dropwise added to the mixed solution with stirring. The resultant mixed solution is filtered to give a clean coating composition.

Step 13-2

Formation of Interpolymer Complex Film

The coating composition obtained in step 13-1 is spin-coated on a resist pattern formed in substantially similar manner to step 1-1 of Example 1 to form a uniform film. The uniform film is baked at about 153° C. for about 60 seconds and rinsed with deionized water. A water-insoluble interpolymer complex film is uniformly formed on the surface of the resist pattern. An i-hole pattern and a d-hole pattern have a diameter of about 96.6 nm and about 125.7 nm, respectively.

EXAMPLE 14

This Example is performed in a similar manner to Example 4 except that a partially hydrolyzed tetraethylorthosilicate (TEOS) is used as a silicon-containing material.

Step 14-1

Preparation of Coating Composition

A solution of about 100 mg of triethanolamine in about 100 mg $H_2O$, a solution of about 320 mg of partially hydrolyzed TEOS in about 7.68 g $H_2O$, and a solution of about 4.0 mg of a surfactant (trade name: Zonyl-FSN, DuPont) in about 396 mg $H_2O$ are added to a solution of about 180 mg of poly (vinylpyrrolidone-co-vinylcaprolactam) (vinylpyrrolidone:vinylcaprolactam=50:50) in about 1.62 g $H_2O$ to obtain a mixed solution. About 3.4 g of $H_2O$ is further added to obtain a diluted mixed solution. A solution of about 20 mg of poly (acrylic acid-co-maleic acid) in about 180 mg $H_2O$ is dropwise added to the diluted mixed solution with stirring. Some precipitates and hydrogels created during the dropwise adding are dispersed by ultrasonic treatment followed by filtration to provide a clean coating composition.

Step 14-2

Formation of Interpolymer Complex Film

The coating composition obtained in step 14-1 is spin-coated on a resist pattern formed in substantially similar manner to step 1-1 of Example 1 to form a uniform film. The uniform film is baked at about 120° C. for about 60 seconds and rinsed with deionized water. A water-insoluble interpolymer complex film is uniformly formed on the surface of the resist pattern. An i-hole pattern and a d-hole pattern have a diameter of about 81.0 nm and about 95.1 nm, respectively.

EXAMPLE 15

This Example is performed in a similar manner to Example 14 except that TEOS is used as a silicon-containing material.

Step 15-1

Preparation of Coating Composition

A solution of about 50 mg of triethanolamine in about 50 mg $H_2O$, a solution of about 320 mg of TEOS in about 7.68 g $H_2O$, and a solution of about 4.0 mg of a surfactant (trade name: Zonyl-FSN, DuPont) in about 396 mg $H_2O$ are added to a solution of about 190 mg of poly(vinylpyrrolidone-co-vinylcaprolactam) (vinylpyrrolidone:vinylcaprolactam=50:50) in about 1.71 g $H_2O$ to obtain a mixed solution. About 3.5 g of $H_2O$ is further added to obtain a diluted mixed solution. A solution of about 10 mg of poly(acrylic acid-co-maleic acid) in about 90 mg $H_2O$ is dropwise added to the diluted mixed solution. Some precipitates created during the dropwise adding are dispersed by ultrasonic treatment followed by filtration to provide a clean coating composition.

Step 15-2

Formation of Interpolymer Complex Film

The coating composition obtained in step 15-1 is spin-coated on a resist pattern formed in substantially similar manner to step 1-1 of Example 1 to form a uniform film. The uniform film is baked at about 110° C. for about 60 seconds and rinsed with deionized water. A water-insoluble interpolymer complex film is uniformly formed on the surface of the resist pattern. An i-hole pattern is in a "not open" state, also called "closed hole pattern", and a d-hole pattern has a diameter of about 89.8 nm.

EXAMPLE 16

This Example is performed in a similar manner to Example 14 except that TEOS is used as a silicon-containing material.

Step 16-1

Preparation of Coating Composition

A solution of about 25 mg of triethanolamine in about 25 mg $H_2O$, a solution of about 120 mg of TEOS in about 2.88 g $H_2O$, and a solution of about 2.0 mg of a surfactant (trade name: Zonyl-FSN, DuPont) in about 198 mg $H_2O$ are added to a solution of about 90 mg of poly(vinylpyrrolidone-co-vinylcaprolactam) (vinylpyrrolidone:vinylcaprolactam=50:50) in about 810 mg $H_2O$ to obtain a mixed solution. About 2.75 g of $H_2O$ is further added to obtain a diluted mixed solution. A solution of about 10 mg of poly(acrylic acid-co-maleic acid) in about 90 mg $H_2O$ is dropwise added to the diluted mixed solution. Some precipitates created during the dropwise adding are dispersed by ultrasonic treatment followed by filtration to provide a clean coating composition.

Step 16-2

Formation of Interpolymer Complex Film

The coating composition obtained in step 16-1 is spin-coated on a resist pattern formed in substantially similar manner to step 1-1 of Example 1 to form a uniform film. The uniform film is baked at about 120° C. for about 60 seconds and rinsed with deionized water. A water-insoluble interpolymer complex film is uniformly formed on the surface of the resist pattern. An i-hole pattern and a d-hole pattern have a diameter of about 70.3 nm and about 109.9 nm, respectively.

EXAMPLE 17

Step 17-1

Formation of Resist Pattern

An antireflective film (DUV-30, Nissan Chemical Industries, Ltd.) is formed to a thickness of about 360° C. on an 8-inch bare silicon wafer. A photoresist for ArF (SAIL-G24c, ShinEtsu Chemical Co. Ltd) is spin-coated on the antireflective film followed by baking at about 110° C. for about 60 seconds to form a resist film with a thickness of about 2,500 Å. The resist film is exposed to light by an ArF (193 nm) stepper followed by post-exposure baking (PEB) at about 105° C. for about 60 seconds. The wafer is developed using a 2.38 wt % TMAH solution to form a resist pattern having a plurality of openings on the wafer. The resist pattern has an i-hole pattern with a diameter of about 196.3 nm and a d-hole pattern with a diameter of about 134.7 nm at a center portion of a hole array in which a plurality of holes are patterned at a pitch of about 210 nm×about 260 nm.

Step 17-2

Preparation of Coating Composition

A solution of about 20 mg of triethanolamine in about 1,980 mg $H_2O$, a solution of about 320 mg of 3-glycidoxypropyltrimethoxysilane in about 7.68 g mg $H_2O$, and a solution of about 4.0 mg of a surfactant (trade name: Zonyl-FSN, DuPont) in about 396 mg $H_2O$ are added to a solution of about 180 mg of poly (vinylpyrrolidone-co-vinylcaprolactam) (vinylpyrrolidone:vinylcaprolactam=50:50) in about 1.62 g $H_2O$ to obtain a mixed solution. About 1.6 g of $H_2O$ is further added thereto to obtain a diluted mixed solution. A solution of about 20 mg of poly(acrylic acid-co-maleic acid)) in about 180 mg $H_2O$ is dropwise added to the diluted mixed solution with stirring. Some precipitates and hydrogels created during the dropwise adding are dispersed by ultrasonic treatment followed by filtration to provide a clean coating composition.

Step 17-3

Formation of Interpolymer Complex Film

The coating composition obtained in step 17-2 is spin-coated on the resist pattern formed in step 17-1 to form a uniform film. The uniform film is baked at about 85° C. for about 60 seconds and rinsed with deionized water. A water-insoluble interpolymer complex film is uniformly formed on the surface of the resist pattern. The i-hole pattern and the d-hole pattern have a diameter of about 147.7 nm and about 126.7 nm, respectively.

According to exemplary embodiment of the present invention, an interpolymer complex film may be formed on the surface of a resist pattern to obtain a mask pattern. The mask pattern is formed with small-sized openings beyond the wavelength limit of photolithography technology. The interpolymer complex film may be a water-insoluble film that includes a network formed by a hydrogen bond between a proton donor polymer and a proton acceptor polymer. The mask pattern including the resist pattern and the interpolymer complex film formed on the resist pattern can maintain a vertical sidewall profile. Furthermore, iso-dense bias can be minimized upon width reduction of the openings. In addition, when BLR or MLR process is performed using a coating composition including a silicon-containing material, the interpolymer complex film is formed on a top resist pattern, thereby increasing a silicon content in the top resist pattern. Therefore, a resistance to dry etching increases, thereby ensuring a high pattern duty ratio.

Although exemplary embodiments have been described herein with reference to the accompanying drawings, it is to be understood that the present invention is not limited to those precise embodiments, and that various other changes and modifications may be affected therein by one of ordinary skill in the related art without departing from the scope or spirit of the invention. All such changes and modifications are intended to be included within the scope of the invention as defined by the appended claims.

What is claimed is:

1. A mask pattern for semiconductor device fabrication, which comprises:
    a resist pattern formed on a semiconductor substrate; and
    an interpolymer complex film formed on the resist pattern, wherein the interpolymer complex film includes a network formed by a hydrogen bond between a proton donor polymer and a proton acceptor polymer, wherein the proton acceptor comprises a first repeat unit, wherein the first repeat unit includes a monomer unit having an amido group, and wherein the proton donor polymer comprises a first repeat unit, wherein the first repeat unit is a maleic acid monomer unit having a carboxyl group or a sulfonic group.

2. The mask pattern of claim 1, wherein the interpolymer complex film is water-insoluble.

3. The mask pattern of claim 1, wherein the network of the interpolymer complex film comprises an acid.

4. The mask pattern of claim 1, wherein the interpolymer complex film comprises a silicon.

5. The mask pattern of claim 1, wherein the first repeat unit includes a maleic acid monomer unit represented by the following Formula:

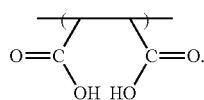

6. The mask pattern of claim 5, wherein the proton donor polymer further comprises a second repeat unit including at least one of an acrylic monomer unit, a vinyl monomer unit, an alkyleneglycol monomer unit, an ethyleneimine monomer unit, an oxazoline group-containing monomer unit, an acrylonitrile monomer unit, an allyamide monomer unit, a 3,4-dihydropyrane monomer unit, and a 2,3-dihydrofurane monomer unit.

7. The mask pattern of claim 6, wherein the first repeat unit of the proton donor polymer is present in an amount of about 3 to about 90%, based on the total number of the repeat units.

8. The mask pattern of claim 1, wherein the proton donor polymer has a weight average molecular weight of about 1,000 to about 100,000 daltons.

9. The mask pattern of claim 1, wherein the proton acceptor polymer comprises a first repeat unit, wherein the first repeat unit includes a vinyl monomer unit represented by the following Formula:

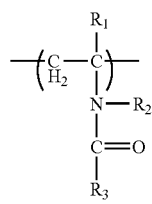

wherein, $R_1$ is a hydrogen atom or a methyl group, $R_2$ and $R_3$ are a hydrogen atom or an alkyl group of $C_1$ to $C_5$, and $R_2$ and $R_3$ can be connected in a form of $—R_2—R_3—$.

10. The mask pattern of claim 9, wherein the proton acceptor polymer comprises a first repeat unit represented by the following Formula:

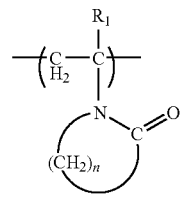

wherein, n is an integer of 1 to 5.

11. The mask pattern of claim 10, wherein the proton acceptor polymer comprises a first repeat unit, wherein the first repeat unit includes a vinyl pyrrolidone monomer unit.

12. The mask pattern of claim 10, wherein the proton acceptor polymer includes a first repeat unit, wherein the first repeat unit includes a vinyl caprolactam monomer unit.

13. The mask pattern of claim 1, wherein the proton acceptor polymer includes a first repeat unit, wherein the first repeat unit includes a vinyl monomer unit represented by the following Formula:

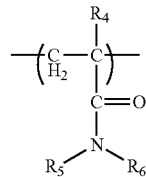

wherein, $R_4$ is a hydrogen atom or a methyl group, $R_5$ and $R_6$ are a hydrogen atom, a methyl group, an n-propyl group, an i-propyl group, an aminopropyl group, or an N,N-dimethylaminopropyl group.

14. The mask pattern of claim 1, wherein the proton acceptor polymer further comprises a second repeat unit, wherein the second repeat unit includes at least one of an acrylic monomer unit, a vinyl monomer unit, an alkyleneglycol monomer unit, an ethyleneimine monomer unit, an oxazoline group-containing monomer unit, an acrylonitrile monomer unit, an allylamide monomer unit, a 3,4-dihydropyrane monomer unit, and a 2,3-dihydrofurane monomer unit.

15. The mask pattern of claim 9, wherein the first repeat unit of the proton acceptor polymer is used in an amount of about 3 to about 100%, based on the total number of repeat units.

16. The mask pattern of claim 1, wherein the proton acceptor polymer has a weight average molecular weight of about 1,000 to about 100,000 daltons.

17. The mask pattern of claim 1, wherein the interpolymer compex film includes a first polymer which is a proton donor polymer, a second polymer which is a proton acceptor polymer, and a third polymer which is not used as the proton donor polymer or the proton acceptor polymer.

18. The mask pattern of claim 17, wherein the third polymer is polyvinylalcohol.

19. The mask pattern of claim 1, wherein the resist pattern is made of a resist material including a Novolak resin and a diazonaphthoquinone (DNQ)-based compound.

20. The mask pattern of claim 1, wherein the resist pattern is formed using a chemically amplified resist composition including a photo-acid generator (PAG).

21. The mask pattern of claim 1, wherein the resist pattern is formed using a resist composition for g-line, a resist composition for i-line, a resist composition for KrF excimer laser, a resist composition for ArF excimer laser, a resist composition for $F_2$ excimer laser, or a resist composition for e-beam.

22. The mask pattern of claim 1, wherein the resist pattern is formed using a positive-type resist composition or a negative-type resist composition.

23. The mask pattern of claim 1, wherein the resist pattern is formed with a plurality of openings defining a hole pattern.

24. The mask pattern of claim 1, wherein the resist pattern is formed with a plurality of lines defining a line and space pattern.

* * * * *